United States Patent [19]

Tomishima et al.

[11] Patent Number: 6,147,925
[45] Date of Patent: Nov. 14, 2000

[54] SEMICONDUCTOR DEVICE ALLOWING FAST SENSING WITH A LOW POWER SUPPLY VOLTAGE

[75] Inventors: Shigeki Tomishima; Tsukasa Ooishi, both of Hyogo, Japan

[73] Assignee: Mitsubishi Denki Kabushiki Kaisha, Tokyo, Japan

[21] Appl. No.: 09/338,581

[22] Filed: Jun. 23, 1999

[30] Foreign Application Priority Data

Jan. 7, 1999 [JP] Japan ................................. 11-001821

[51] Int. Cl.$^7$ ...................................................... G11C 8/00
[52] U.S. Cl. ...................... 365/230.03; 365/196; 365/100
[58] Field of Search .............................. 365/230.03, 226, 365/189.05, 100, 148, 63, 196

[56] References Cited

U.S. PATENT DOCUMENTS 5,798,976  8/1998  Arimoto ................................. 365/222

FOREIGN PATENT DOCUMENTS 3-160684  7/1991  Japan .

OTHER PUBLICATIONS

"Development of 64M bit DRAM ($3^{rd}$ Generation)", S. Tsukada et al. NEC Technical Journal, vol. 50, No. 3, 1997, pp. 23–27.

"A 1.2–to 3.3–V Wide Voltage–Range/Low–Power DRAM with a Charge–Transfer Presensing Scheme", M. Tsukude, et al. IEEE Journal of Solid–State Circuits, vol. 32, No. 11, Nov. 1997, pp. 1721–1727.

*Primary Examiner*—David Nelms
*Assistant Examiner*—Thong Le
*Attorney, Agent, or Firm*—McDermott, Will & Emery

[57] ABSTRACT

In a shared sense amplifier structure, a bit line isolating gate connecting a selected memory block and a sense amplifier circuit is set to a high-resistance ON state when a sensing operation is performed, and the high-resistance ON state is held during a row selected state. A semiconductor memory device allowing fast access with a low power consumption is implemented.

17 Claims, 19 Drawing Sheets

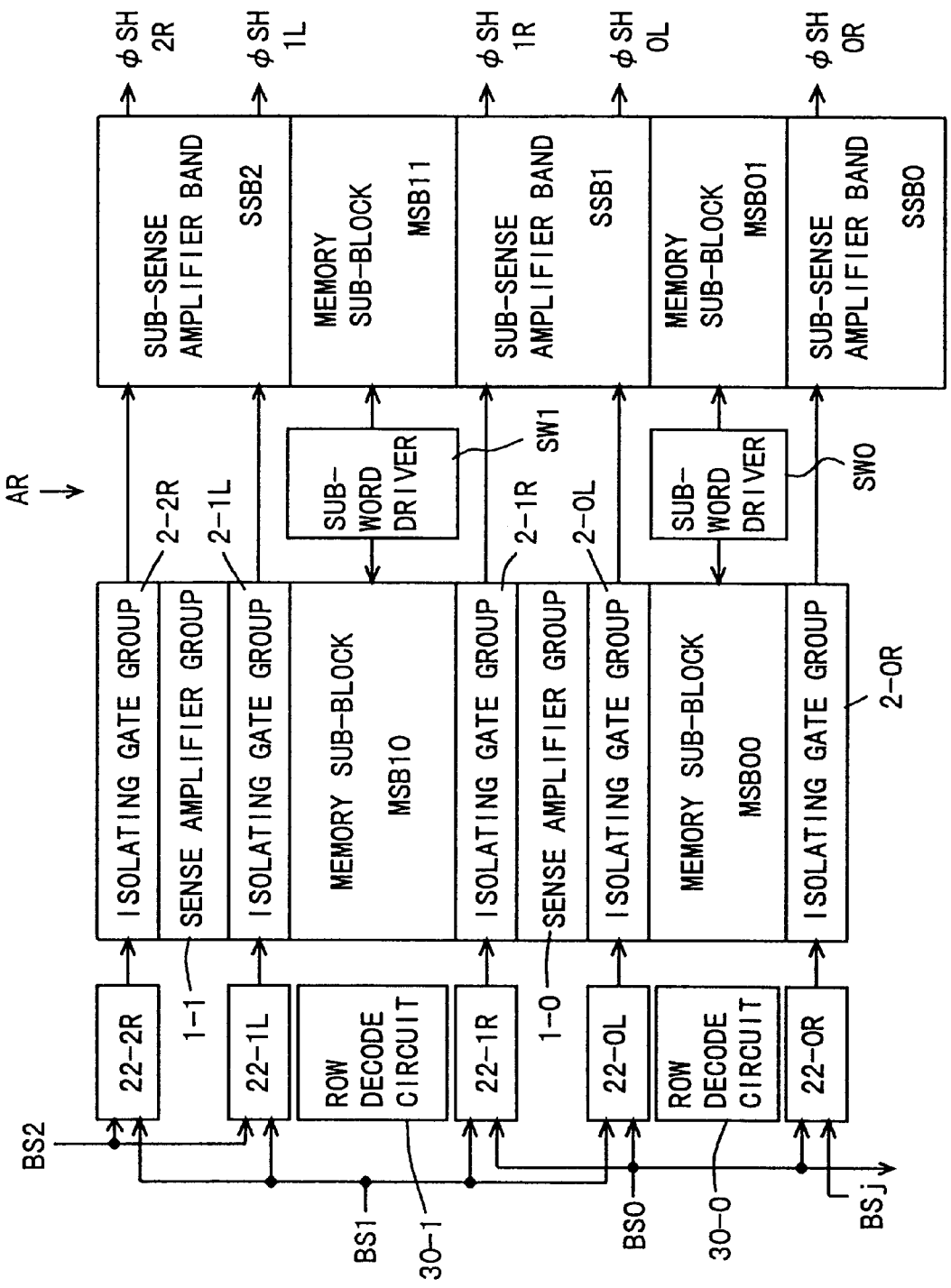
F I G. 17

F I G. 1 8
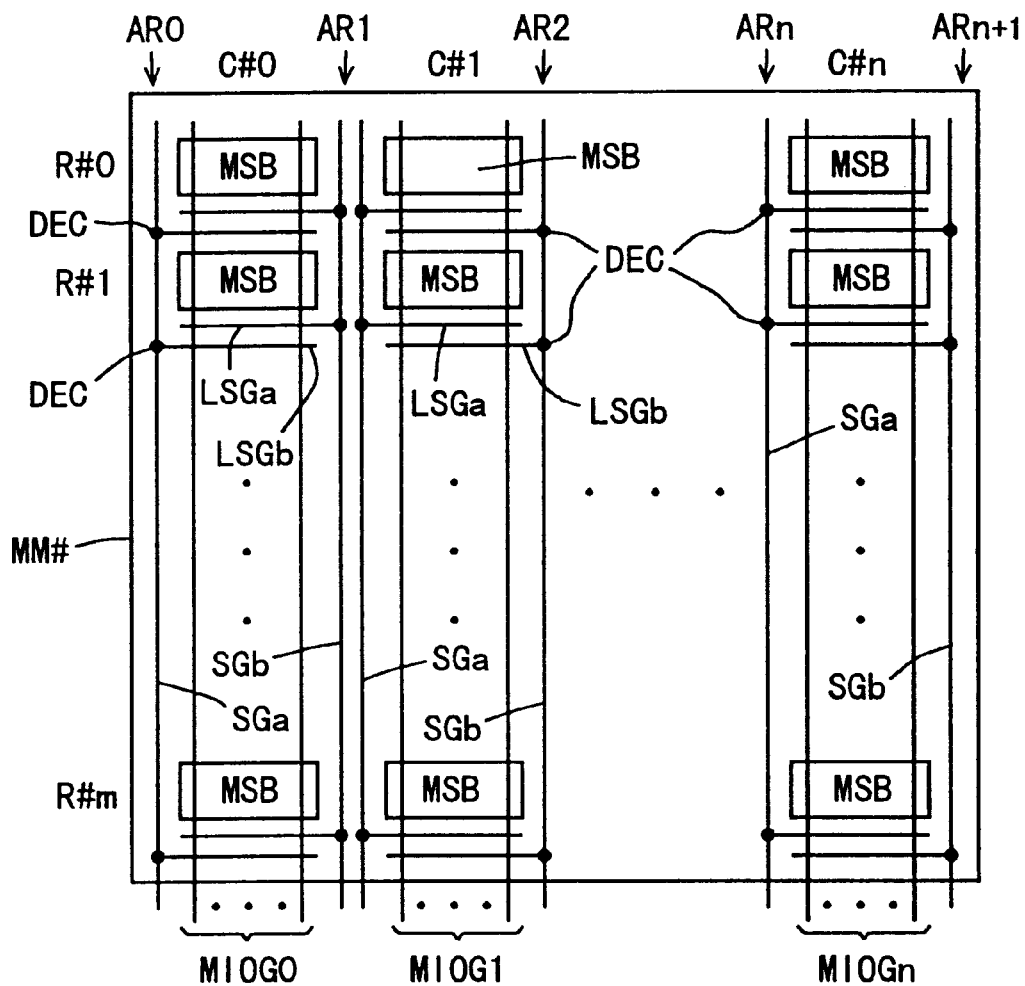

(FROM COLUMN DECODER)

OUTPUT HIGH IMPEDANCE WHEN INACTIVE

F I G. 3 0   PRIOR ART

SEMICONDUCTOR DEVICE ALLOWING FAST SENSING WITH A LOW POWER SUPPLY VOLTAGE

BACKGROUND OF THE INVENTION

1. Field of the Invention

The present invention relates to a semiconductor memory device, and particularly to a semiconductor memory device allowing fast sensing. More particularly, the invention relates to a semiconductor memory device of a shared sense amplifier structure, which can perform fast sensing operation to allow fast access to sense amplifiers.

2. Description of the Background Art

FIG. 30 shows a shared sense amplifier structure in the prior art. In FIG. 30, a sense amplifier SA is arranged between bit lines BLL and /BLL included in a memory sub-block MAL and bit lines BLR and /BLR included in a memory sub-block MAR. Bit lines BLL and /BLL as well as bit lines BLR and /BLR are coupled to sense amplifier SA via bit line isolating gates BIGL and BIGR, respectively. These bit lines BLL and BLR as well as complementary bit lines /BLL and /BLR are equivalent to divided bit lines of bit lines BL and /BL. Sense amplifier SA is arranged in a substantially central position between these bit lines BLL and BLR and between bit lines /BLL and /BLR.

Sense amplifier SA includes an n-channel MOS transistor Q1 having conduction nodes connected to bit line BL and a common source node S2N, respectively, and a gate coupled to complementary bit line /BL, an n-channel MOS transistor Q2 having conduction nodes connected to complementary bit line /BL and common source node S2N, respectively, and a gate connected to bit line BL, a p-channel MOS transistor Q3 having conduction nodes connected to bit line BL and common source node S2P, respectively, and a gate connected to complementary bit line /BL, and a p-channel MOS transistor Q4 having conduction nodes connected to complementary bit line /BL and common source node S2P, respectively, and a gate connected to bit line BL.

MOS transistors Q1 and Q2 are cross-coupled, and discharge a lower potential bit line of bit lines BL and /BL when made active. MOS transistors Q3 and Q4 are cross-coupled, and charges a higher potential bit line of bit lines BL and /BL when made active. For activating sense amplifier SA, an n-channel MOS transistor Q5 which is turned on in response to activation of a sense amplifier activating signal φSON to connect common source node S2N to a source ground line SGD, and a p-channel MOS transistor Q6 which is turned on in response to activation of a sense amplifier activating signal φSOP to connect common source node S2P to a source power supply line SVC are provided.

Bit line isolating gate BIGL includes transfer gates TX1 and TX2 formed of n-channel MOS transistors, and is made conductive when a bit line isolation instructing signal φSHRL is active (at L-level), to isolate bit lines BLL and /BLL from bit lines BL and /BL (sense nodes), respectively. Bit line isolating gate BIGR likewise includes transfer gates T3 and T4 formed of n-channel MOS transistors, and is made conductive when a bit line isolation instructing signal φSHRR is active (L-level), to isolate bit lines BL and /BL from bit lines BLR and /BLR, respectively.

For bit lines BL and /BL, an equalize circuit BEQ for equalizing bit lines BL and /BL (BLL, BLR, /BLL and /BLR) to a predetermined potential VBL during standby, and a column select gate CSG for connecting bit lines BL and /BL to internal data lines I/O and ZI/O in accordance with a column select signal YS on a column select line CSL received from a column decoder (not shown), respectively are further provided.

Equalize circuit BEQ includes an n-channel MOS transistor Q7 which is turned on in response to activation of an equalize instructing signal φEQ to electrically short-circuit bit lines BL and /BL, and n-channel MOS transistors Q8 and Q9 which transmit a predetermined voltage (intermediate voltage) VBL onto bit lines BL and /BL in response to activation of equalize instructing signal φEQ, respectively.

Column select gate CSG includes n-channel MOS transistors Q10 and Q11 which are turned on in response to activation of column select signal YS, to connect bit lines BL and /BL to internal data lines I/O and ZI/O, respectively. In a standby cycle, bit line isolation instructing signals φSHRL and φSHRR are at H-level so that bit lines BLL and BLR are connected to bit line BL, and bit lines /BLL and /BLR are connected to bit line /BL. In the standby cycle, bit line equalize instructing signal BEQ is active, and these bit lines BL, BL, BLR, /BL, BL and /BLR are equalized to intermediate voltage VBL.

Generally, common source nodes S2N and S2P of sense amplifier SA are commonly used by a plurality of sense amplifiers, and are equalized to the intermediate voltage level.

In memory sub-blocks MAL and MAR, word lines are arranged in the direction crossing bit lines BLL and /BLL as well as bit lines BLR and /BLR. Memory cells are arranged corresponding to the crossings between word lines and bit lines. In a dynamic type semiconductor memory device, the memory cell has a memory cell structure of one-transistor/one-capacitor type. Operation of the shared sense amplifier shown in FIG. 30 will now be described with reference to signal waveforms shown in FIG. 31.

In the standby cycle, bit line equalize instructing signal φEQ is at H-level so that equalize circuit BEQ is activated to equalize bit lines BL and /BL to the level of intermediate voltage VBL. At this time, bit line equalize instructing signals φSHRL and φSHRR are at H-level of a high voltage Vpp, and bit line isolating gates BIGL and BIGR are on, so that intermediate voltage VBL of equalize circuit BEQ is transmitted onto bit lines BLL and /BLL as well as BLR and /BLR. In memory sub-blocks MAL and MAR, the bit lines are precharged to the intermediate voltage level. Sense amplifier activating signals φSON and φSOP are inactive, and therefore sense amplifier SA is inactive.

When a memory cycle starts, bit line equalize instructing signal φEQ first attains the inactive state at L-level, and deactivates equalize circuit BEQ. Then, an operation of selecting a memory sub-block is performed in accordance with an address signal (not shown). It is now assumed that a word line (WL) included in memory sub-block MAR is selected. In this state, bit line isolation instructing signal φSHRL attains the active state at L-level, and bit line isolating gate BIGL is turned off so that bit lines BLL and /BLL are isolated from bit lines BL and /BL. The other bit line isolation instructing signal φSHRR is held at high voltage Vpp as in the standby cycle, and bit lines BLR and /BLR are continuously connected to bit lines BL and /BL, respectively.

Then, row selection is performed in accordance with the address signal. In memory sub-block MAR, selected word line WL is driven to the selected state, and the voltage level thereof rises to high voltage Vpp level. The data of the memory cells connected to selected word line WL are read onto the corresponding bit lines, and the voltage levels on bit lines BL and /BL change in accordance with the read memory cell data. More specifically, one of paired bit lines BL and /BL is connected to a memory cell, and has the voltage level changed in accordance with the memory cell data. The other bit line maintains the precharge voltage level. FIG. 31 shows signal waveforms in the operation where memory cell data at H-level is read onto bit line BL.

When a voltage difference between bit lines BL and /BL sufficiently increases, sense amplifier activating signals φSON and φSOP are activated so that MOS transistors Q5 and Q6 for sense amplifier activation are turned on to activate sense amplifier SA. Since the voltage level on bit line /BL is lower than that on bit line BL, MOS transistors Q1 and Q2 discharge the voltage level of bit line /BL to the ground voltage GND level. The other bit line BL is charged to power supply voltage Vccc level by MOS transistors Q3 and Q4.

After the voltage levels on bit lines BL and /BL are stabilized at power supply voltage Vccc level and ground voltage GND level, respectively, column selection for data access is performed. FIG. 31 shows the operation, in which column selecting operation is successively performed, and the column select signal on column select line CSL successively changes. Column select gate CSG is turned on in accordance with column select signal YS on column select line CSL, and bit lines BL and /BL are connected to internal data lines I/O and ZI/O, respectively, so that data amplified and latched by sense amplifier SA is transmitted onto internal data lines I/O and ZI/O. Then, write/read of data for the selected sense amplifier is performed.

When the memory cycle is completed, word line WL is first driven to the unselected state, and then sense amplifier activating signals φSON and φSOP are driven to the inactive state. Equalize instructing signal φEQ returns to H-level, and bit line isolation instructing signal φSHRL returns to the inactive state at H-level (high voltage Vpp level). Thereby, bit lines BL and /BL return to the initial level, i.e., intermediate voltage VBL level.

In the shared sense amplifier structure shown in FIG. 30, sense amplifier SA is arranged in a central position between bit lines BLL and BLR as well as between /BLL and /BLR. Sense amplifier SA is connected to bit line pair BLR and /BLR or bit line pair BLL and /BLL for performing the sensing operation. Thus, sense amplifier SA is connected only to a half of all the bit lines (BL and /BL) in the sensing operation so that the load to be driven by the sense amplifier is reduced, and the sensing operation can be performed fast. Bit line isolation instructing signals φSHRR and φSHRL are held at high voltage Vpp level when they are inactive. Thereby, the data sensed and amplified by sense amplifier SA can be restored into the original memory cell without a threshold voltage loss across the transfer gate in the bit line isolating gate.

The above operation sequence of the shared sense amplifier structure in the prior art cannot fully satisfy the demands of the semiconductor memory devices in recent years, i.e., the demands for fast operation, large storage capacity and low power consumption. This will now be described.

With increase in storage capacity, components are miniaturized to a higher extent. For ensuring the reliability of components thus miniaturized and reducing the power consumption, a lower power supply voltage is used. Particularly in memory cells, a voltage of an array power supply (sense amplifier power supply) is lowered for ensuring the reliability of the memory cells. As shown in FIG. 32, the memory cell includes a capacitor MQ for storing information, and an access transistor MT for connecting memory cell capacitor MQ to corresponding bit line BL (or /BL) in response to the signal voltage on word line WL. Access transistor MT is formed of an n-channel MOS transistor (insulated gate field effect transistor). In a miniaturizing process, with reduction in size of access transistors MT, a gate insulating film of access transistor MT is reduced in accordance with a predetermined scaling rule for improving on/off controllability by the voltage on the gate electrode of access transistor MT. If access transistor MT has the gate insulating film reduced in thickness, the voltage level of high voltage Vpp which can be applied to word line WL is restricted for preventing dielectric breakdown of the gate insulating film of access transistor MT. Thus, the voltage level of voltage Vpp at H-level on word line WL must be lowered in accordance with miniaturization of the components. When H-level data is to be written into memory cell MC, consideration must be given to the level of voltage Vpp on word line WL and a loss due to the threshold voltage of access transistor MT. Thus, the voltage level on bit line BL is set to Vpp–Vth, where Vth represents the threshold voltage of access transistor MT. Bit line BL is driven by sense amplifier SA. Therefore, the level of voltage Vccc at H-level driven by sense amplifier SA naturally lowers as the voltage level of voltage Vpp at H-level on word line WL lowers.

For reducing the power consumption, charging/discharging currents of sense amplifier SA are to be reduced, and therefore the voltage level of sense amplifier power supply voltage Vccc is lowered. Sense amplifier SA is formed of MOS transistors, and the charging/discharging speed thereof depends on the gate-source voltage. Accordingly, when sense amplifier power supply voltage Vccc lowers, the operation speed of sense amplifier SA lowers and the sensing time increases so that the bit line voltage is made definite at a delayed or slower timing, and the access time increases.

Miniaturization of components results in reduction in pitch of bit lines and increase in parasitic capacitance between bit lines, and also results in increase in parasitic capacitance between a bit line and a signal line which is connected to a gate of a MOS transistor connected to the bit line. Accordingly, the load to be driven by sense amplifier SA increases, and the speed of sensing operation decreases.

For increasing the storage capacity and increasing a cell occupying rate to the array area, the length of bit line is increased, and the number of memory cells connected to each bit line is increased. Thereby, the number of regions of sense amplifier bands (i.e., regions where the sense amplifiers are arranged) is reduced to half, and the chip area is reduced. For example, in 64-Mbit DRAMs at the present time, 128 memory cells are connected to each bit line. However, 256 memory cells are connected to each bit line in 64-Mbit DRAM of the next generation and 256-Mbit DRAM. Each bit line is driven by one sense amplifier SA. As the bit line capacitance increases with increase in number of memory cells, the load to be driven by the sense amplifier increases, and the speed of sensing operation decreases.

The foregoing reduction in sensing operation speed results in delay in access for reading/writing data (because of delay in start of the column selection), and therefore lowers the performance of the memory device.

As the storage capacity increases, the length of internal data lines increases, and the interconnection line capacitance thereof increases. The internal data lines are connected to main amplifiers (not shown). In the data read operation, sense amplifier SA drives the internal data line, and the sense amplifier data is transmitted to the main amplifier. Accordingly, with increase in interconnection line capacitance of the internal data line, delay in data transmission from sense amplifier SA to main amplifier MA increases so that fast data reading cannot be implemented. In the data write operation, and particularly when a write driver drives the internal data line for writing the data into the sense amplifier, delay likewise occurs in data signal transmission from the write driver to the sense amplifier, and fast access cannot be achieved. Since the write driver is required to drive a large parasitic capacitance of the sense amplifier, a long time is required for data writing.

SUMMARY OF THE INVENTION

An object of the invention is to provide a semiconductor memory device which allows fast accessing.

Another object of the invention is to provide a semiconductor memory device of a shared sense amplifier type which allows fast sensing operation.

Still another object of the invention is to provide a semiconductor memory device of a shared sense amplifier type which allows fast sensing operation without increasing a current consumption.

In summary, according to the invention, a bit line isolating gate between a selected memory sub-block and a sense amplifier band is set to a high-resistance ON state upon activation of sense amplifiers in the sense amplifier band, and this state is held while the selected memory sub-block is in the selected state.

The selected memory sub-block and the corresponding sense amplifier group are connected via the high-resistancized conductive isolating gate group, whereby a parasitic capacitance of a bit line in the selected memory sub-block can be substantially isolated from a corresponding sense amplifier in the sense amplifier group, and therefore the sensing operation can be performed fast. The high-resistance ON state of this isolating gate group is held while the selected memory sub-block is in the selected state. Thereby, the current consumption in the sense amplifier can be reduced after completion of the sensing operation. Also, memory cell data can be stably held.

After transmitting the selected memory cell data to the sense amplifier, this sense amplifier is isolated from the bit line pair during the sensing operation. Thereby, the load on the sense amplifier is reduced, and the sensing operation can be performed fast. After completion of row selection, the sense amplifier is connected to the bit line pair, and a restoring operation is performed for transmitting the latched data in the sense amplifier to the selected memory cell. The sense amplifier group is isolated from all the bit line pairs during data accessing. Therefore, it is only necessary to perform the data writing on the selected sense amplifier so that the data writing can be performed fast.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 17 schematically shows an arrangement of the isolation control circuit in the embodiment 1 of the invention;

FIG. 18 schematically shows an arrangement of a memory mat in an embodiment 2 of the invention;

DESCRIPTION OF THE PREFERRED EMBODIMENTS

Embodiment 1

Figure 1:
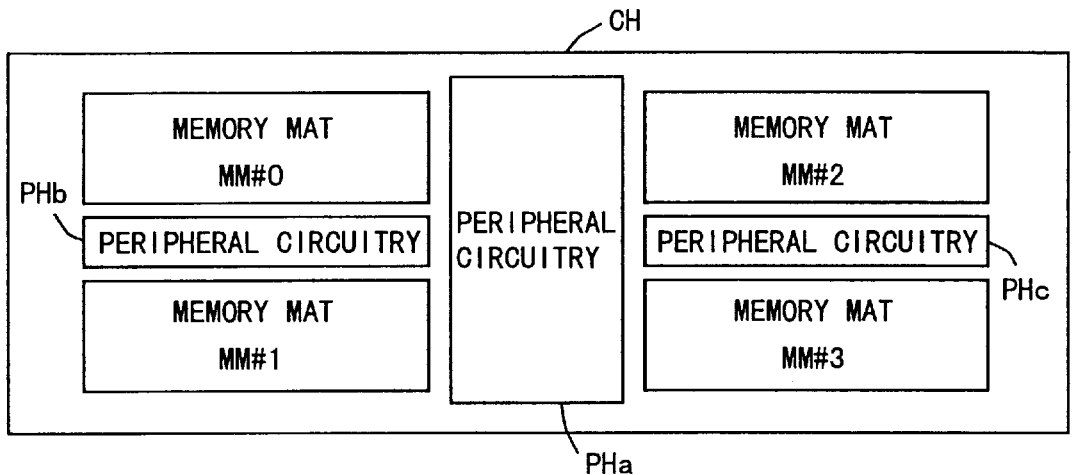
FIG. 1 schematically shows a whole structure of a semiconductor memory device according to the invention.

FIG. 1 schematically shows a whole structure of a semiconductor memory device according to the invention. In FIG. 1, the semiconductor memory device includes memory mats MM#0–MM#3 which are arranged in quad-divided regions of a rectangular region CH, respectively. Rectangular region CH is, e.g., a semiconductor chip. This arrangement of arranging memory mats MM#0–MM#3 in the quad-divided regions of rectangular region CH, respectively, can prevent concentration of power consumption of memory arrays, and can reduce lengths of word and bit lines so that fast operations can be implemented.

Peripheral circuitry PHa is arranged in a central region between memory mats MM#0 and MM#1 and memory mats MM#2 and MM#3. Peripheral circuitry PHb is arranged in a region between memory mats MM#0 and MM#1, and peripheral circuitry PHc is arranged in a region between memory mats MM#2 and MM#3. Peripheral circuitry PHa includes control circuits and data I/O circuits for memory mats MM#0–MM#3. Each of peripheral circuitry PHb and PHc includes a data I/O circuit, a control signal input buffer and an address signal input buffer. By arranging peripheral circuitry PHa, PHb and PHc in the central regions of rectangular region CH, the lengths of interconnection lines transmitting control signals and data signals for memory mats MM#0–MM#3 can be minimized because of symmetrical arrangement, which facilitates the interconnection layout, and can achieve fast signal transmission.

Figure 2:
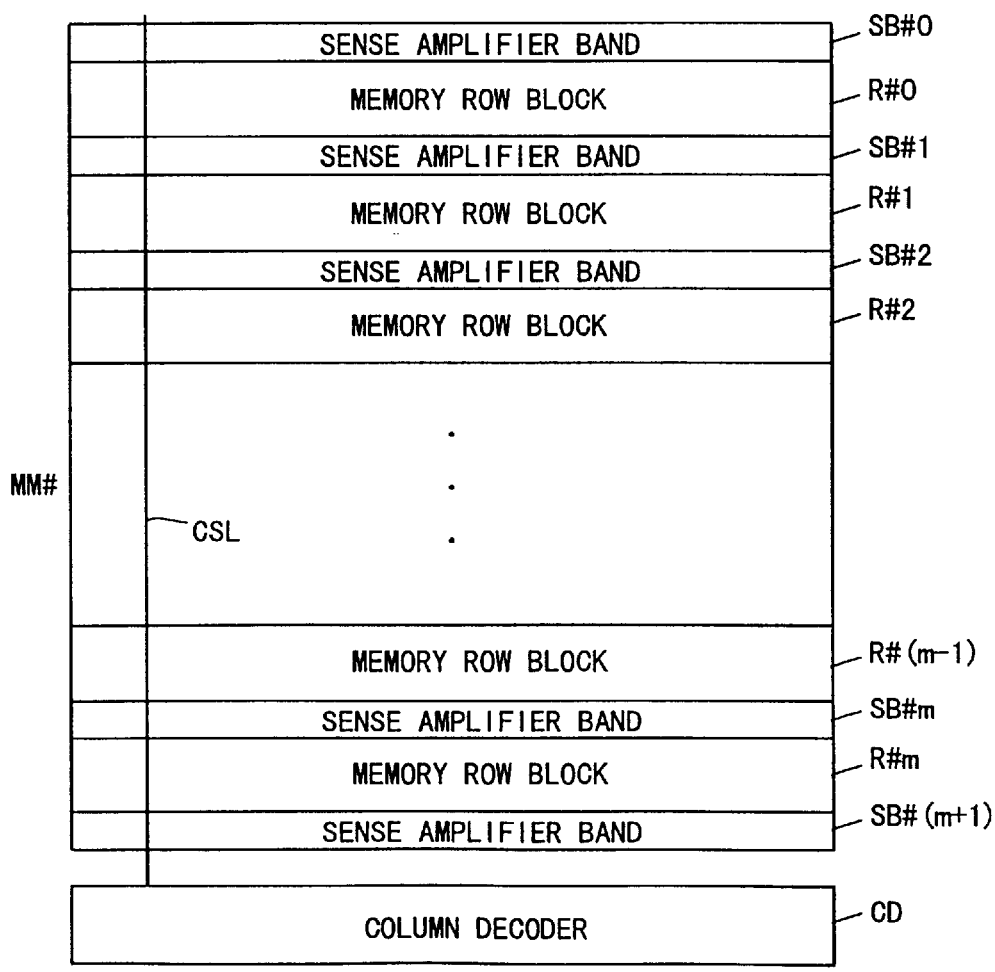
FIG. 2 schematically shows a structure of a memory mat shown in FIG. 1.

FIG. 2 schematically shows a structure of the memory mat shown in FIG. 1. In FIG. 2, only one (MM#) of the memory mats MM#0–MM#3 is shown representatively because memory mats MM#0–MM#3 have the same structures. In FIG. 2, memory mat MM# is divided into a plurality of memory row blocks R#0–R#m arranged in a column direction. Each of memory row blocks R#0–R#m has a plurality of memory cells arranged in rows and columns. Memory row blocks R#0–R#m each share a word line.

Sense amplifier bands SB#1–SB#m are arranged between memory row blocks R#0–R#m, and sense amplifier bands SB#0 and SB#(m+1) are arranged outside memory row blocks R#0 and R#m, respectively. Sense amplifier bands SB#0–SB#(m+1), of which structures will be described later in greater detail, include sense amplifiers arranged corresponding to the respective memory cell columns as well as bit line isolating gate groups for connecting corresponding memory row blocks and the sense amplifier groups. Column select lines CSL extending in the column direction of memory mat MM# are arranged over memory row blocks R#0–R#m for transmitting column select signals from a column decoder CD. A column select signal on column select line CSL drives column select gates included in the sense amplifier bands to the ON state.

In the structure of memory mat MM# shown in FIG. 2, when one memory row block is selected, the sense amplifier bands located on the opposite sides thereof in the column direction are connected to the selected row block. This is because each of sense amplifier bands SB#0–SB#(m+1) includes sense amplifiers corresponding to the alternate bit line pairs (columns), and the shared sense amplifier structure of an alternate arrangement type is employed.

Figure 3:
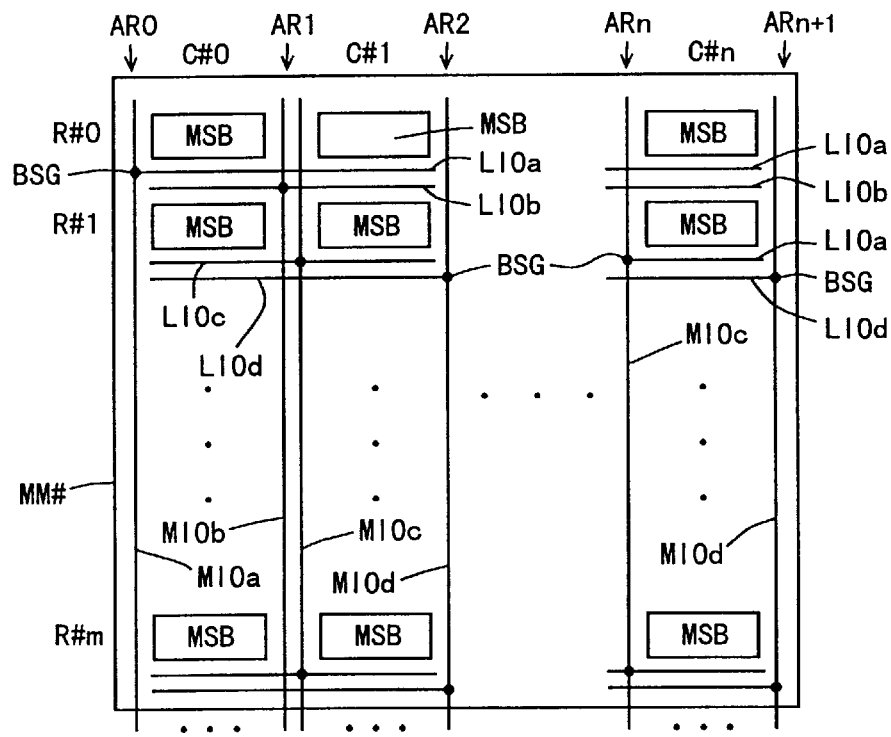
FIG. 3 shows the structure of the memory mat shown in FIG. 1 in greater detail.

FIG. 3 shows more specifically the structure of memory mat shown in FIG. 2. In FIG. 3, each of row blocks R#0–R#m is divided into a plurality of memory sub-blocks MSB arranged in a row direction. Each of column blocks C#0–C#n is formed of memory sub-blocks arranged in the column direction. Local data I/O line pairs LIOa–LIOd are arranged for memory sub-blocks MSB. Each of local data line pairs LIOa–LIOd extends along two memory sub-blocks adjacent in the column direction. Each of local data line pairs LIOa–LIOd is arranged in the sense amplifier band, and is commonly used by two memory sub-blocks adjacent to each other in the column direction.

Main data line pairs MIOa–MIOd extending in the column direction are arranged in regions AR0–ARn+1 between the memory sub-blocks or outside the blocks. Usually, two main data line pairs are arranged in each of inter-block regions AR1–ARn. Each of main data line pairs MIO (MIOa–MIOd) is commonly used by the memory sub-blocks included in a corresponding column block. In accordance with the column select signal from the column decoder shown in FIG. 2, memory cells of four bits are selected in one memory sub-block, and the memory cell data of selected four bits are transmitted onto main data line pairs LIOa–LIOd through local data line pairs LIOa–LIOd, respectively. Block select gates BSG connect local data line pairs LIOa–LIOd to main data line pairs MIOa–MIOd, respectively.

Block select gate BSG is controlled of turn on and off by a row block designating signal. Connection between the local data line pairs and the main data line pairs may be made in accordance with the row block designating signal and in parallel with the row selecting operation, or may be made in the column selecting operation. What is required is that connection between the local data line pairs and global data line pairs is already established when a memory cell data is accessed.

Regions AR0–ARn+1 between blocks or outside blocks may be so-called word line shunt regions. The word line shunt region is a region where a high-resistance polycrystalline silicon layer connected to a gate of a memory cell transistor (access transistor) is electrically connected to a conductive layer of a low resistance at an upper layer. The memory cell is not present in this region. In the structure of the memory mat having the word line shunt region, word lines in a row block extend in the row direction, and are shared by memory sub-blocks MSB included in the row block.

Regions AR0–ARn+1 between or outside memory sub-blocks may be regions where word line sub-drivers are arranged. The word line sub-driver operate in accordance with a signal on a main word line and a row predecode signal for specifying a word line, and drives a corresponding sub-word line to the selected state. The sub-word line is actually connected to memory cells. In the above structure including main word lines and sub-word lines, the main word lines extend in the row direction within row blocks R#i (i=0–m), and the sub-word lines extend in the row direction only within the memory sub-block.

Figure 4:
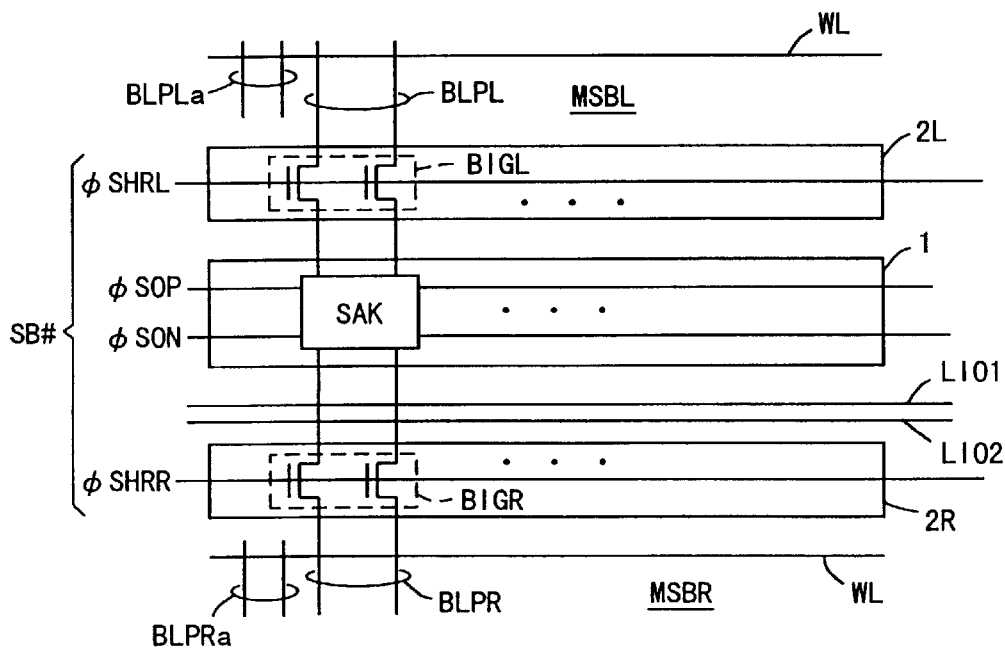
FIG. 4 schematically shows a structure of a sense amplifier band shown in FIG. 2.

FIG. 4 schematically shows a structure of a sense amplifier group provided corresponding to the memory sub-blocks adjacent each other in the column direction. More specifically, FIG. 4 shows a structure of the sense amplifier band located between memory sub-blocks MSBL and MSBR.

Figure 5:
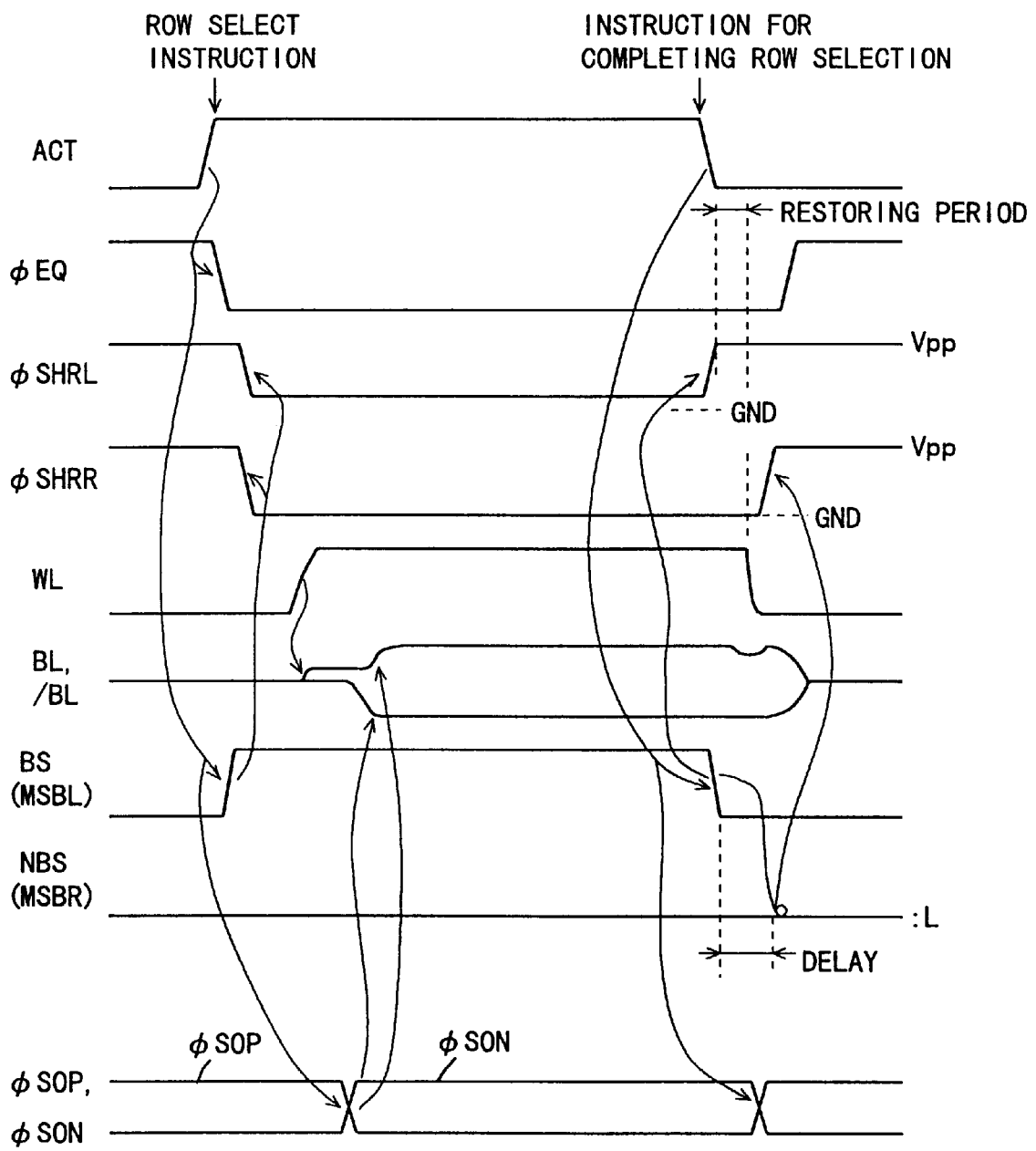
FIG. 5 is a signal waveform diagram representing operation of the sense amplifier band shown in FIG. 4.
Figure 30:
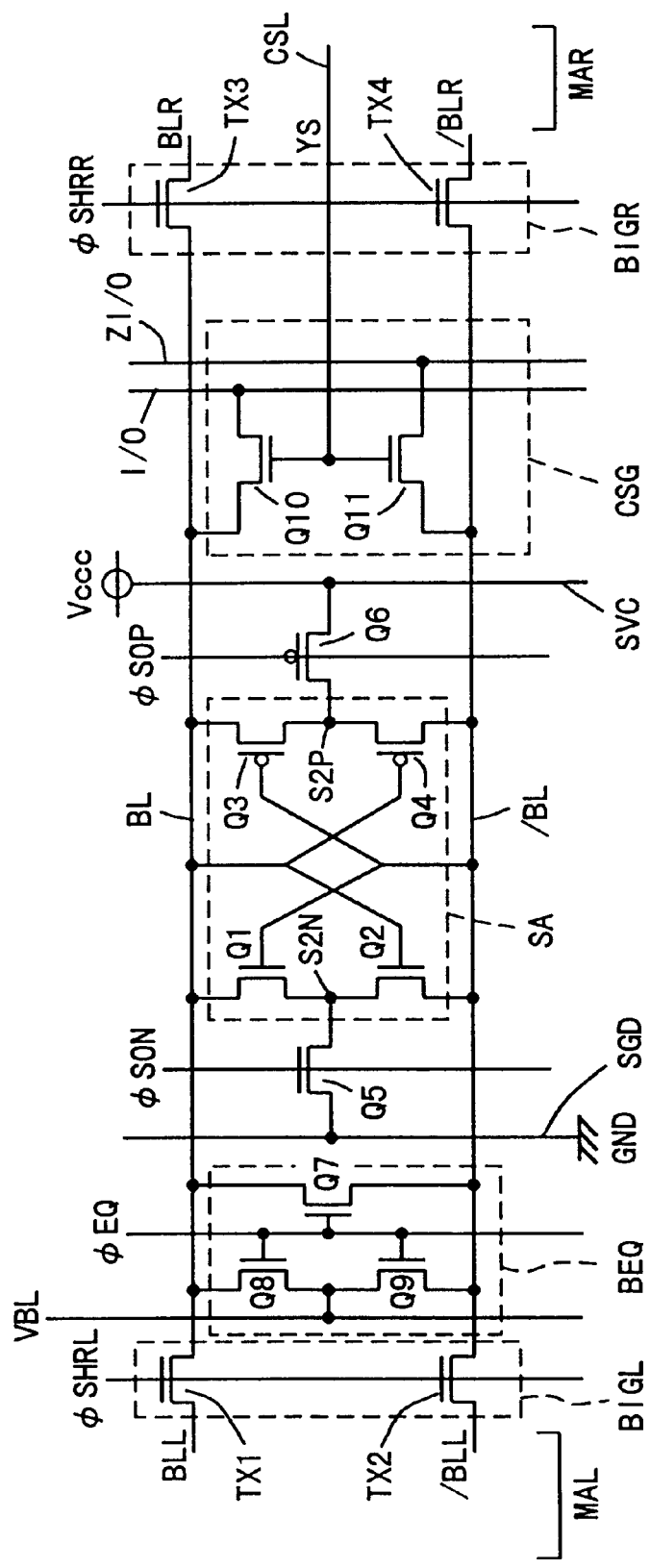
FIG. 30 shows a structure of a shared sense amplifier in a conventional semiconductor memory device.
Figure 31:
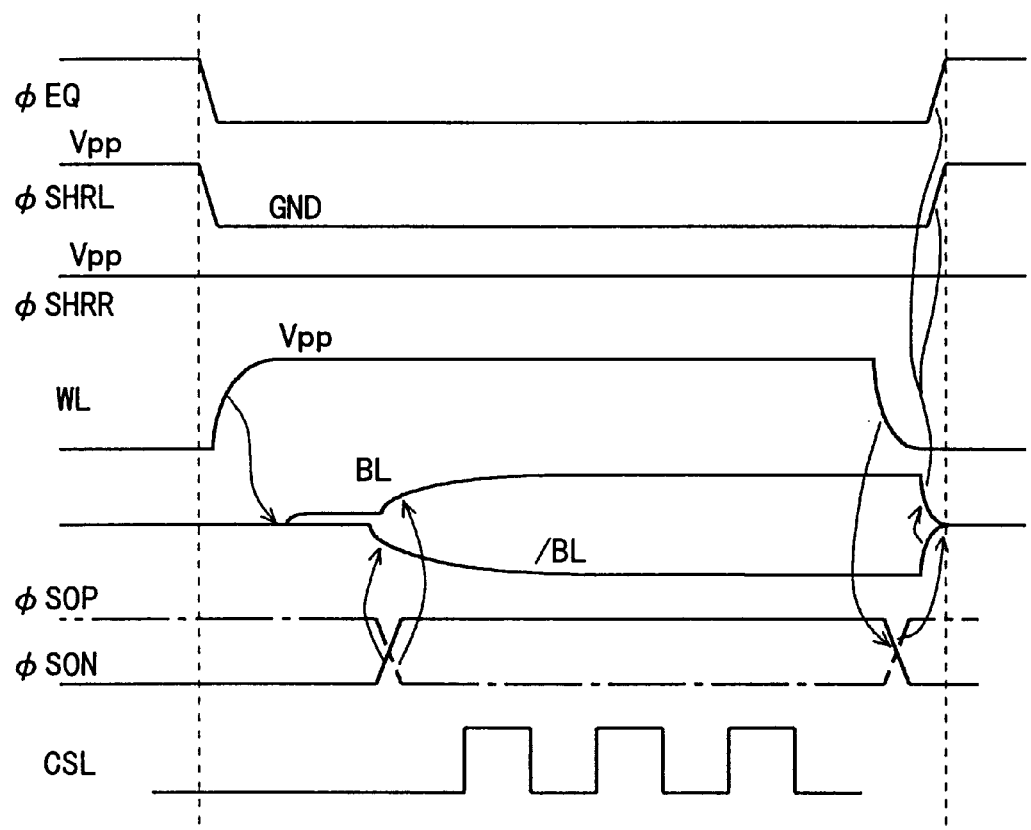
FIG. 31 is a signal waveform diagram representing operation of a shared sense amplifier shown in FIG. 30.
Figure 32:
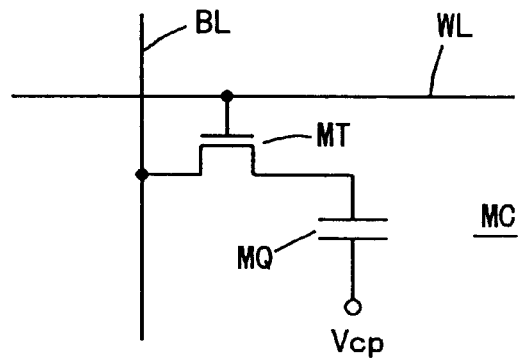
FIG. 32 schematically shows a structure of a memory cell in the convention semiconductor memory device.

In FIG. 4, sense amplifier band SB# includes a sense amplifier group 1 including sense amplifier circuits SAK each arranged corresponding to bit line pairs BLPL and BLPR in memory sub-blocks MSBL and MSBR, a bit line isolating gate group 2L arranged between sense amplifier group 1 and bit line pairs BLPL of memory sub-block MSBL, and a bit line isolating gate group 2R arranged between sense amplifier group 1 and bit line pairs BLPR included in memory sub-block MSBR. In memory sub-block MSBL, bit line pair BLPLa is coupled to the bit line isolating gate (not shown). In memory sub-block MSBR, bit line pair BLPRa is coupled to the bit line isolating gate group (not shown). Thus, bit line isolating gate group 2L includes bit line isolating gates BIGL provided corresponding to alternate bit line pairs BLPL in memory sub-block MSBL. Likewise, bit line isolating gate group 2R includes bit line isolating gates BIGR provided corresponding to alternate bit line pairs BLPR in memory sub-block MSBR. Sense amplifier circuit SAK includes sense amplifier SA and activating transistors Q5 and Q6 shown in FIG. 24. Similarly to the structure shown in FIG. 24, sense amplifier group 1 includes bit line equalize circuits and others, but these are not shown in the figure for simplicity. The structure of the sense amplifier band is substantially the same as the structure shown in FIG. 30. Operation of the structure shown in FIG. 4 will now be described with reference to signal waveforms shown in FIG. 5.

During standby, equalize instructing signal EQ (not shown in FIG. 4) is at H-level, and bit line pair BLPL and BLPR is precharged to and equalized at an intermediate voltage level. Both bit line isolation instructing signals φSHRL and φSHRR are at high voltage Vpp level, and bit line isolating gates 2L and 2R are on. Bit line pairs BLPL and BLPR in memory sub-blocks MSBL and MSBR are coupled to the corresponding sense amplifier circuit SAK in sense amplifier group 1.

When a row select instruction is applied, an array activating signal ACT is driven to the active state at H-level. In accordance with activation of array activating signal ACT, equalize instructing signal EQ attains the inactive state at L-level, and stops the operation of equalizing each bit line pair. When the row select instruction is applied, a block designating signal BS designating a row block including a selected memory cell is driven to the selected state in accordance with an address signal. It is now assumed that block designating signal BS for the row block including memory sub-block MSBL is driven to the selected state. In this case, a block designating signal (adjacent block designating signal) NBS for unselected memory sub-block MSBR, which is paired with the selected memory sub-block, maintains L-level. In accordance with block designating signal BS, isolation control signal φSHRL for isolating gate 2L arranged between memory sub-block MSBL and sense amplifier group 1 lowers from high voltage Vpp level to the intermediate voltage level. The voltage level of isolation control signal φSHRL is higher than ground voltage GND so that isolating gate BIGL attains the ON state (conductive state) of a high resistance. For isolating gate group 2R between memory sub-block MSBR and sense amplifier group 1, isolation control signal φSHRR lowers to the ground voltage GND level, and isolating gate group 2R is turned off. Thereby, sense amplifier group 1 is isolated from memory sub-block MSBR.

The row selection is performed in accordance with a row address signal applied simultaneously with the instruction of row selection. In this operation, the voltage level of selected word line WL corresponding to an addressed row rises, and data of a memory cell connected to the selected word line is transmitted onto bit lines BL or /BL (bit line pair BLPL). The level of a sum of the read voltage and the equalize voltage on the bit line is lower than the voltage level of isolation control signal φSHRL, and the read voltage on bit line pair BLPL (BL and /BL) is transmitted to corresponding sense amplifier circuit SAK via bit line isolating gate BIGL.

Sense amplifier activating signals φSON and φSOP are successively activated, and sense amplifier circuit SAK performs the sensing operation to sense, amplify and latch the memory cell data applied via bit line isolating gate BIGL (bit line isolating gate group 2L). Isolation control signal φSHRL is at a sufficiently low positive voltage level, and isolating gate BIGL is in a conductive, but high-resistance state. Therefore, the parasitic capacitance of bit line pair BLPL can be equivalently isolated from sense amplifier circuit SAK, and the sensing operation can be performed fast. After the sensing operation of this sense amplifier, a column select operation is performed. Since the sensing operation by the sense amplifier is performed fast, the column selection can be performed at an advanced timing, and fast access can be achieved. Further, the charging/discharging speed in the sensing operation is slow because the load is small. Therefore, no variation occurs in the sense amplifier power supply voltage so that the sensing operation can be performed accurately.

When the access to required data is completed, array activating signal ACT is driven to the inactive state at L-level in accordance with an instruction of completing the row selection. In response to deactivation of array activating signal ACT, block select signal BS is first driven to L-level, and isolation control signal φSHRL is driven from the intermediate voltage level to high voltage Vpp level. Responsively, the isolating gate group 2L in the high-resistance ON state changes to the low-resistance ON state, and the data latched in sense amplifier group 1 is transmitted onto bit line pair BLPL of memory sub-block MSBL via isolating gate BIGL included in isolating gate 2L, and restoring of the memory cell data is performed. After completion of this restoring, word line WL is driven to the unselected state, and then sense amplifier activating signals φSOP and φSON are driven to the inactive state. Thereafter, isolation control signal φSHRR is driven from ground voltage GND level to high voltage Vpp level, and equalize instructing signal φEQ is activated again. Thereby, bit line pairs BLPL and BLPR are coupled to sense amplifier circuit SAK, and are equalized to the predetermined intermediate voltage level by the equalize circuit included in the sense amplifier band.

Figure 6:
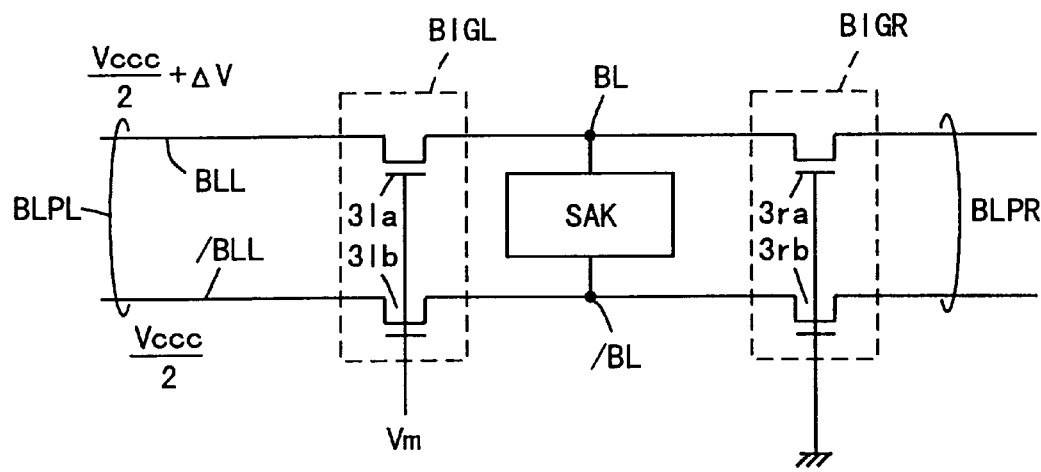
FIG. 6 shows voltages applied to a bit line isolating gate in the embodiment 1 of the invention.

FIG. 6 shows voltages on portions related to one sense amplifier SAK in the sensing operation. In FIG. 6, transfer gates 31a and 31b included in bit line isolating gate BIGL are supplied with an intermediate voltage Vm on their gates. When data at H-level is read onto bit line BLL, the voltage level on bit line BLL goes to (Vccc/2+ΔV), and bit line /BLL maintains the voltage level of equalize voltage Vccc/2. Meanwhile, bit line /BLL maintains the voltage level of the equalize voltage Vccc/2. Transfer gates 3ra and 3rb in isolating gate BIGR are supplied on their gates with the ground voltage, and bit line pair BLPR is isolated from sense amplifier circuit SAK.

Figure 7:
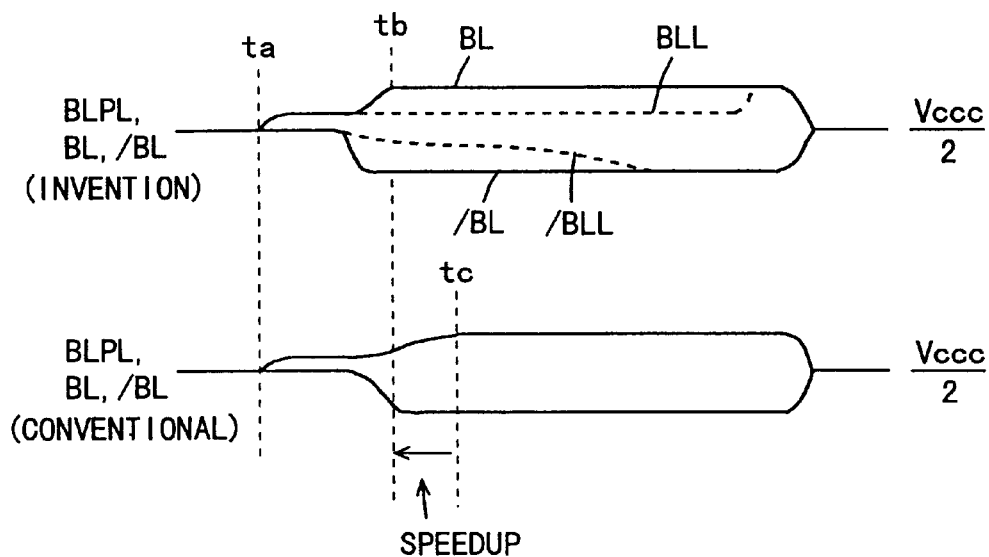
FIG. 7 shows the voltage change on bit lines upon voltage application shown in FIG. 6.

In the sense amplifier circuit SAK, corresponding bit lines BL and /BL are equalized to the level of intermediate voltage Vccc/2 during standby. The operation of the structure shown in FIG. 6 will now be described with reference to a signal waveform diagram of FIG. 7.

At time ta, the word line is selected, and data at H-level is read onto bit line BLL so that the voltage level on bit line BLL rises by read voltage ΔV from equalize voltage Vccc/2. Bit line /BLL maintains the voltage level of intermediate voltage Vccc/2. As will be described later, the voltage level of intermediate voltage Vm is set to the voltage level allowing transmission of this voltage on bit line BLL onto bit line BL of sense amplifier circuit SAK. Accordingly, the memory cell data read at time ta is transmitted onto bit lines BL and /BL via bit line isolating gate BIGL. When sense amplifier circuit SAK is activated, bit line /BL is rapidly driven to the ground voltage level. The voltage drop on bit line /BL is transmitted onto bit line /BLL in accordance with an RC time constant of the parasitic capacitance of bit line /BLL and transfer gate 31b in the high-resistance state. Thus, the voltage level on bit line /BLL slowly lowers as indicated by dotted line in FIG. 7.

When sense amplifier circuit SAK in transfer gate 31a is activated, the voltage level on bit line BL rises. Thereby, a node connected to bit line BLL serves as the source of transfer gate 31a, and bit line BL is rapidly driven to power supply voltage Vcc level without an influence of capacitance of bit line BLL. Although depending on the voltage level of intermediate voltage Vm, a difference between intermediate voltage Vm and the voltage on bit line BLL may be substantially equal to the threshold voltage of transfer gate 31a. In this case, the voltage level on bit line BLL holds the read voltage level as indicated by dotted line in FIG. 7 (because transfer gate 31a maintains substantially OFF state).

Bit lines BL and /BL are hardly affected by the parasitic capacitance of bit lines BLL and /BLL during the sensing operation of sense amplifier circuit SAK. Therefore, sense amplifier circuit SAK is required only to drive the parasitic capacitance of bit lines BL and /BL (parasitic capacitance of the pn junction of sense amplifier transistors, and parasitic capacitance of bit lines BL and /BL), and can perform fast sensing operation.

If the control voltage applied to isolating gate BIGL is at high voltage Vpp level similarly to the prior art, bit lines BL and /BL are electrically connected to bit lines BLL and /BLL, respectively, and substantially the same voltage variations occur on bit lines BLL and BL as well as complementary bit lines /BLL and /BL. Accordingly, sense amplifier circuit SAK is further required to drive the parasitic capacitance of bit lines BLL and /BLL so that a long time is required until completion of the sensing operation. In the prior art, therefore, the voltage levels on bit lines BL and /BL are made definite at time tc. In the present invention the sensing operation by sense amplifier circuit SAK is completed, and the voltage levels on bit lines BL and /BL are mode definite at time tb. According to the instant invention, therefore, the column selection can be performed immediately after time tb, in contrast to the prior art in which the column selection can be started at time tc. Accordingly, the instant invention can achieve faster access. Now, description is given on the level of intermediate voltage Vm of the isolation control signal.

Bit line isolating gate BIGL must be set to the high-resistance state while keeping ON state. A MOS transistor is turned on when the gate-source voltage exceeds a threshold voltage thereof. Bit lines BL and /BL are held at the voltage level of intermediate voltage Vccc/2. Therefore, in order to transmit read voltage ΔV read onto bit line BLL to a sense node (bit line BL) of sense amplifier circuit SAK, intermediate voltage Vm of the isolation control signal must satisfy the following relations:

$Vccc > Vm \geq Vccc/2 + \Delta V + Vth$, or $Vm \sim Vth$, when $Vth \geq Vccc/2 + \Delta V$, where Vth represent a threshold voltage of each of transfer gates 31a, 31b, 3ra and 3rb. By using the lower limit of intermediate voltage Vm defined above, therefore, the read voltage is transmitted to the sense nodes (bit lines BL and /BL) of sense amplifier circuit SAK and the sensing operation can be reliably performed even when data at H-level is read out. Upper limit Vccc of intermediate voltage Vm is determined depending on the condition of the high-resistance state.

When the read voltage is negative, the bit line held at the intermediate voltage level is merely driven to power supply voltage Vccc level. The bit line held at the equalize voltage level is initially charged at a slow rate by sense amplifier circuit SAK. However, the gate-source voltage of the transfer gate is substantially at the threshold voltage level, and when the bit line voltage at the intermediate voltage (equalize voltage) level rises to a certain intermediate voltage level, sense amplifier circuit SAK stops the operation of charging the bit line in the memory sub-block. Since the transfer gate has an extremely large resistance value, although the sense node is charged rapidly at the initial stage of the sensing, the bit line voltage in the memory sub-block rises slowly, and the current consumption is small. Thereafter, the sense nodes (bit lines BL and /BL) of sense amplifier circuit SAK are rapidly charged. In the memory sub-block, the bit line supplied with the read voltage of −ΔV is slowly discharged by the sense amplifier circuit, similarly to the waveforms depicted by dotted line in FIG. 7 (sense node is discharged rapidly). This is because the threshold voltage Vth of the transfer gate is much larger than absolute value ΔV of read voltage, and the transfer gate has the gate-source voltage set at a level of a threshold voltage thereof and is kept at substantially OFF state.

When L-level data is read, gate-source voltage Vgs of the transfer gate goes to (Vth+2·ΔV) if Vm is equal to (Vcc/2+Vth+ΔV). It is now assumed that the transfer gate is formed of a transistor having a low threshold voltage. Even in the case of Vth=0.2 V and ΔV=20 mV, Vgs is equal to 0.24 V so that the transfer gate is close is state to the OFF state, and the load on the sense amplifier can be sufficiently small.

In any one of the above cases, therefore, sense amplifier circuit SAK is required only to charge/discharge the parasitic capacitance of bit lines BL and /BL (sense nodes) and the junction capacitance of transistors of the sense amplifier circuit, and the sensing operation can be performed fast with a low current consumption to drive voltages on bit lines BL and /BL to the levels of power supply voltage Vccc and ground voltage GND, respectively. Therefore, the sense amplifier circuit operating fast with a low current consumption can be implemented.

Figure 8:
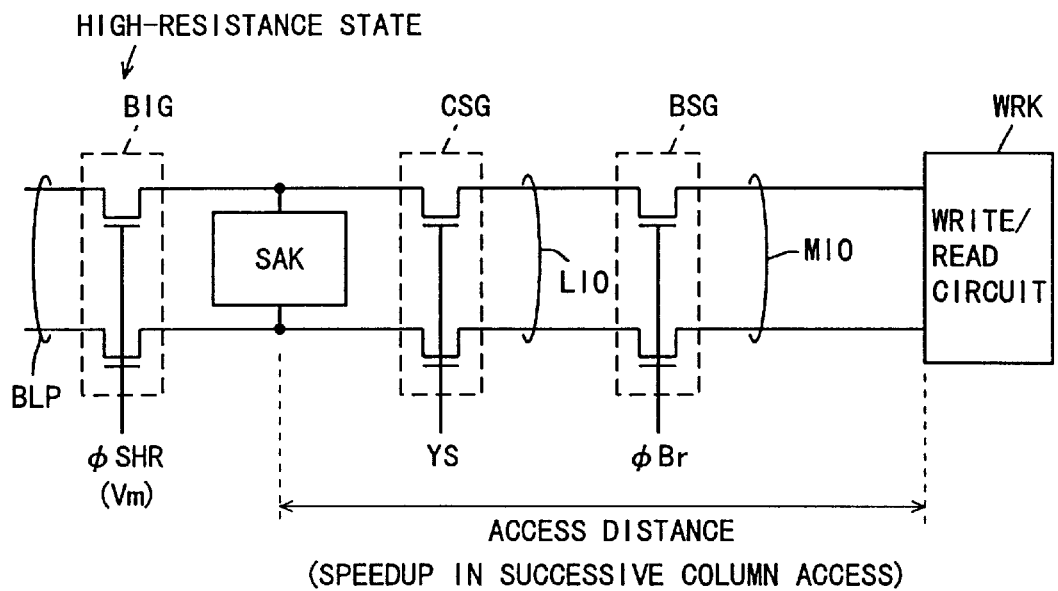
FIG. 8 schematically shows data write/read circuit for one sense amplifier circuit in the embodiment 1 of the invention.

FIG. 8 schematically shows a data write/read path related to one bit line pair. Bit line pair BLP is connected to sense amplifier circuit SAK via bit line isolating gate BIG. Sense amplifier circuit SAK is coupled to local data line pair LIO via column select gate CSG. Local data line pair LIO is coupled to main data line pair MIO via block select gate BSG. Main data line pair MIO is coupled to a write/read circuit WRK for writing and reading internal data.

Bit line isolating gate BIG receives isolation control signal φSHR, and column select gate CSG receives column select signal YS from the column decoder. Block select gate BSG receives a block select signal φBr from the block decoder (not shown). When column select gate CSG and block select gate BSG are selected, these gates are in the low-resistance state so that sense amplifier circuit SAK, local data line pair LIO and main data line pair MIO are connected via low-resistances, and only the parasitic capacitance and interconnection line capacitance of local and main data line pairs LIO and MIO are present between write/read circuit WRK and sense amplifier circuit SAK.

Bit line isolating gate BIG is in the high resistance state because isolation control signal φSHR is at the level of intermediate voltage Vm. When write/read circuit WRK writes or reads data, sense amplifier circuit SAK is substantially isolated from bit line pair BLP. Therefore, for successively selecting columns while a word line is held in the selected state (memory sub-block is in the selected state), write/read circuit WRK is required only to access sense amplifier circuit SAK. It is not necessary to give consideration to the load capacitance of bit line pair BLP, and fast writing and reading of data is implemented.

While the sensing operation is performed, sense amplifier circuit SAK and bit line pair BLP have their parasitic capacitance substantially isolated from each other. In this state, the charging/discharging current of sense amplifier circuit SAK in the sensing operation can be reduced (because it is merely required to charge/discharge the sense nodes (bit lines BL and /BL)). Accordingly, the sense charging/discharging current does not cause variation in sense power supply such as rapid lowering of sense power supply voltage Vccc or rising of sense ground voltage GND, and the sensing operation can be stably performed.

Figure 9:
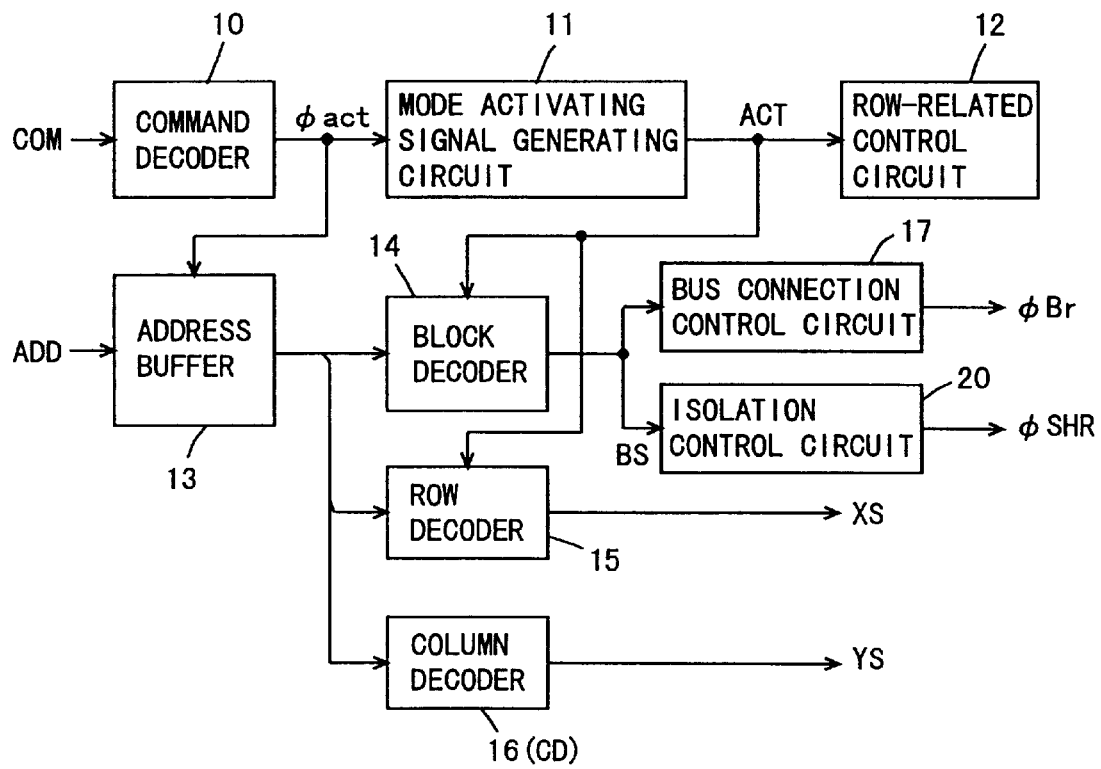
FIG. 9 schematically shows a structure of a control signal generating circuit in the embodiment 1 of the invention.

FIG. 9 schematically shows a structure of a peripheral control circuit generating control signals. In FIG. 9, the peripheral control circuit includes a command decoder 10 for decoding an externally applied command COM to generate an operation mode designating signal in accordance with the result of decoding, a mode activating signal generating circuit 11 generating a mode activating signal for activating the designated mode in accordance with the operation mode designating signal from command decoder 10, and a row-related control circuit 12 for controlling the operations of circuits related to row selection in response to activation of array activating signal ACT sent from mode activating signal generating circuit 11.

The command decoder 10 takes in and decodes command COM supplied thereto in synchronization with the clock signal. Command COM is applied as a set of a plurality of control signals, and an operation mode is designated in accordance with a combination of logical states of these control signals. FIG. 9 shows a row selection designating signal φact designating the row select operation.

Mode activating signal generating circuit 11 activates array activating signal ACT upon activation of row selection designating signal φact. When command decoder 10 applies a row selection completion instructing signal (precharge instructing signal), mode activating signal generating circuit 11 drives array activating signal ACT to the unselected state. Mode activating signal generating circuit 11 activates a signal instructing data read/write when it is supplied with the read/write command (access command) instructing read/write of data.

In accordance with activation of array activating signal ACT, row-related control circuit 12 deactivates the bit line equalize circuit, activates the word line select operation and activates the sense amplifier.

The peripheral control circuit further includes a block decoder 14 which decodes a block address signal from an address buffer 13 to generate row block designating signal BS, a row decoder 15 which decodes a row address signal from address buffer 13 to generate a row select signal XS for driving the addressed row to the selected state, and a column decoder 16 (CD) which decodes an internal column address signal from address buffer 13 to generate a column select signal YS.

Address buffer 13 latches an applied address signal to produce an internal address signal in accordance with the operation mode designating signal from command decoder 10. FIG. 9 shows the state where address buffer 13 latches an applied address signal ADD in response to row selection designating signal φact from command decoder 10. Block decoder 14 and row decoder 15 are activated to perform decoding in response to activation of array activating signal ACT from mode activating signal generating circuit 11, and hold the results of decoding. Column decoder 16, which corresponds to column decoder CD shown in FIG. 1, is activated to perform decoding when a column selection designating signal (access command) is applied.

The peripheral control circuit further includes a bus connection control circuit 17 which generates a bus selection control signal φBr for controlling connection between the local and global data buses in accordance with row block designating signal BS from block decoder 14, and an isolation control signal 20 which generates bit line isolation control signal φSHR in accordance with row block designating signal BS from block decoder 14. Connection control signal φBr from bus connection control circuit 17 connects only the local data bus provided for a selected row block to the main data bus. The timing for connection between the main and local data buses may be determined such that the connection is performed in parallel with the row selection, or is performed when an access command is applied.

The isolation control signal 20 generates isolation control signal φSHR in accordance with row block designating signal BS from block decoder 14, as already described.

Row-related control circuit 12, block decoder 14, row decoder 15, column decoder 16, bus connection control circuit 17 and isolation control circuit 20 are provided for each of memory mats MM#0–MM#3 shown in FIG. 1. Command decoder 10, mode activating signal generating circuit 11 and address buffer 13 are arranged commonly to memory mats MM#0–MM#3.

Figure 10:
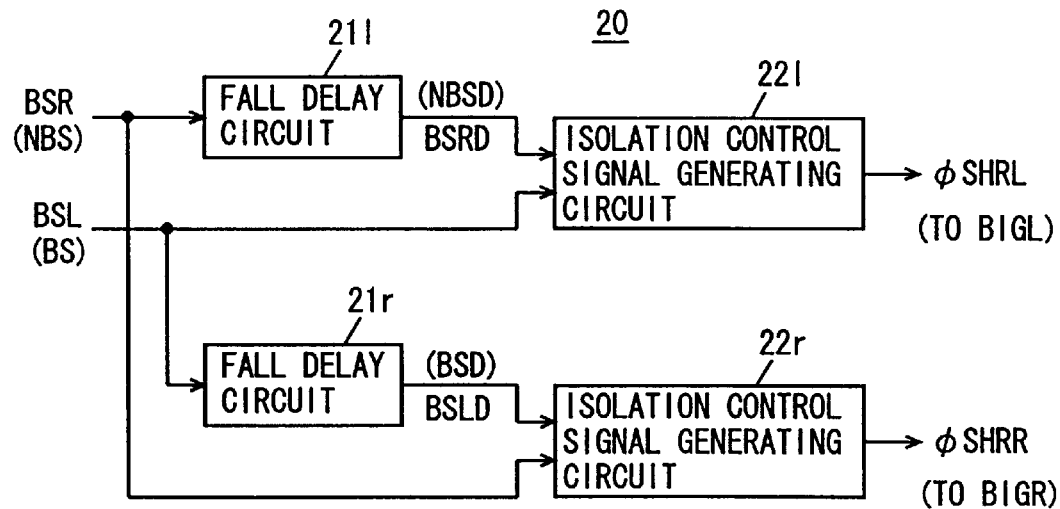
FIG. 10 schematically shows a structure of an isolation control circuit shown in FIG. 9 for one sense amplifier band.

FIG. 10 schematically shows a structure of isolation control circuit 20 shown in FIG. 9, and particularly a circuit portion provided corresponding to one sense amplifier band. In FIG. 10, isolation control circuit 20 includes a fall delay circuit 21*l* which delays transition (fall) of adjacent block designating signal NBS (BSR) from the active state to the inactive state by a predetermined time, an isolation control signal generating circuit 22*l* which receives block designating signal BS (BSL) and an adjacent block designating signal NBSD (BSRD) from fall delay circuit 21*l* and generates isolation control signal φSHRL for the isolating gate group, a fall delay circuit 21*r* which delays transition of block select signal BS(BSL) to the inactive state by a predetermined time, and an isolation control signal generating circuit 22*r* which receives block designating signal (adjacent block designating signal) BSD (BSLD) from fall delay circuit 21*r* as well as block designating signal NBS (BSR), and generates isolation control signal φSHRR.

For isolating gate group BIGL, block designating signal BSR serves as an adjacent block designating signal NBS. For isolating gate group BIGR, block designating signal BSL serves as adjacent block designating signal NBS.

When block designating signals BS or NBS is deactivated, isolation control signal generating circuit 22*l* or 22*r* drives corresponding isolation control signal φSHRL or φSHRR from intermediate voltage Vm level to high voltage Vpp level. For the adjacent memory sub-block, fall delay circuit 21*l* or 21*r* delays deactivation of block designating signal NBSD or BSD by a predetermined time. Therefore, a word line enters the unselected state after the restore operation in response to deactivation of block designating signals BS or NBS, and thereafter the isolation control signal at the ground voltage level is driven to high voltage Vpp level. The sense amplifier is deactivated after completion of the restore operation, and the deselected isolating gate group is connected to the sense amplifier group, so hat the unselected memory block is equalized. In the restore operation, the sense amplifier group is required to drive only the bit line pairs in the selected memory block, and therefore the restoring can be performed fast with a low current consumption.

The isolation control circuit portion shown in FIG. 10 is provided for each sense amplifier band.

Structure 1 of Isolation Control Signal Generating Circuit

Figure 11:
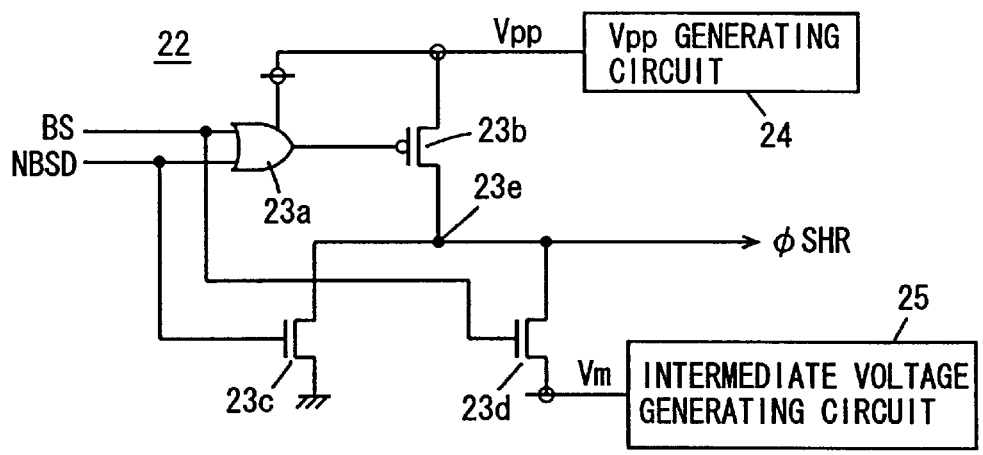
FIG. 11 shows a structure of an isolation control signal generating circuit shown in FIG. 10.

FIG. 11 shows an example of the structure of isolation control signal generating circuits 22*l* and 22*r* shown in FIG. 10. Isolation control signal generating circuits 22*l* and 22*r* differ from each other only in combination of block designating signals applied thereto, and have the same circuit structure. Accordingly, FIG. 11 shows representatively an isolation control signal generating circuit 22.

In FIG. 11, isolation control signal generating circuit 22 includes an OR circuit 23*a* receiving block designating signal BS and delayed adjacent block designating signal NBSD from the fall delay circuit, a p-channel MOS transistor 23*b* turned on to transmit high voltage Vpp generated from a Vpp generating circuit 24 to an output node 23*e* when the output signal of OR circuit 23*a* is at L-level (inactive), an n-channel MOS transistor 23*c* turned on to discharge output node 23*e* to the ground voltage level when delayed adjacent block designating signal NBSD is at H-level (active state), and an n-channel MOS transistor 23*d* turned on to transmit intermediate voltage Vm, generated sent from an intermediate voltage generating circuit 25 to output node 23*e* when block designating signal BS is at H-level. From output node 23*e* isolation control signal φSHR is generated. OR circuit 23*a* has a level converting function, and produces a signal at H-level of high voltage Vpp.

When block select signal BS or adjacent block designating signal NBS is driven to the selected state, the output signal of OR circuit 23*a* attains H-level of high voltage Vpp, and MOS transistor 23*b* is turned off. When block designating signal BS is in the selected state, MOS transistor 23*d* is on, and intermediate voltage Vm from intermediate voltage generating circuit 25 is transmitted to output node 23*e*. Responsively, isolation control signal φSHR lowers from high voltage Vpp level to intermediate voltage Vm level. When adjacent block designating signal NBS is in the selected state, MOS transistor 23*c* is ON, and isolation control signal φSHR is at the ground voltage level.

Upon transition to the standby state, block select signals BS and NBSD attain L-level, and the output signal of OR circuit 23*a* attains L-level so that MOS transistor 23*b* is turned on, and isolation control signal φSHR attains high voltage Vpp level. At this time, MOS transistors 23*c* and 23*d* maintain the OFF state. By utilizing fall delay circuits 21*l* and 21*r* (see FIG. 10), transition of adjacent block designating signal NBS to the inactive state can be delayed by a predetermined time, and the isolation control signal φSHR can be driven to high voltage Vpp level after completion of the restore operation in the adjacent block. When the corresponding memory block is in the selected state, MOS transistor 23*b* is turned on in response to deactivation of block select signal BS so that isolation control signal φSHR attains high voltage Vpp level, and the restoring is performed.

Figure 12:
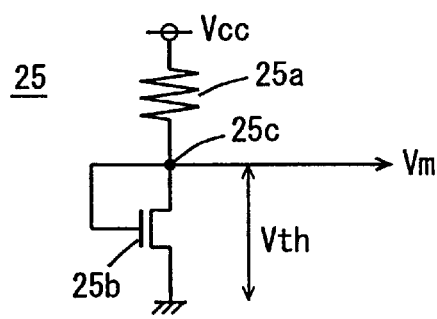
FIG. 12 shows a structure of an intermediate voltage generating circuit shown in FIG. 11.

FIG. 12 shows an example of the structure of intermediate voltage generating circuit 25 shown in FIG. 11. In FIG. 12, intermediate voltage generating circuit 25 includes a resistance element 25*a* of a high resistance connected between the power supply node and an output node 25*c*, and an n-channel MOS transistor 25*b* connected between output node 25*c* and the ground node and having a gate connected to output node 25*c*. Resistance element 25*a* has the resistance value much larger than the ON-resistance (channel resistance) of MOS transistor 25*b*. Therefore, MOS transistor 25*b* operates in the diode mode, and causes voltage drop of threshold voltage Vth thereof. In the structure of intermediate voltage generating circuit 25 shown in FIG. 12, intermediate voltage Vm is at the level of threshold voltage Vth of MOS transistor 25*b*. Voltage Vcc on the power supply node may be the power supply voltage used side the chip.

The structure of the intermediate voltage generating circuit shown in FIG. 12 is employed for the condition of driving under a low power supply voltage, and satisfies the following relation:

$$Vth > Vccc/2 + \Delta V$$

When array power supply voltage (sense amplifier power supply voltage) Vccc is, e.g., 1.2 V and read voltage ΔV is 20 mV, threshold voltage Vth of 0.7 V can sufficiently satisfy the foregoing relation. Threshold voltage Vth is set to an appropriate value depending on the values of sense amplifier power supply voltage Vccc and the voltage that can be sensed by the sense amplifier and may be smaller than read voltage ΔV. Threshold voltage Vth of MOS transistor 25*b* is adjusted by a known art such as ion implantation into a channel region.

Structure 2 of Isolation Control Signal Generating Circuit

Figure 13:
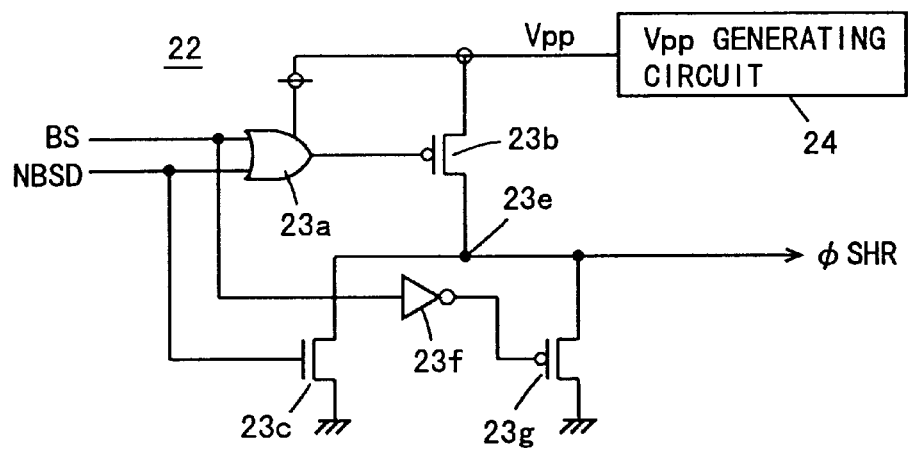
FIG. 13 shows another structure of the isolation control signal generating circuit shown in FIG. 10.

FIG. 13 shows another structure of the isolation control signal generating circuit shown in FIG. 10. In isolation control signal generating circuit 22 shown in FIG. 13, a p-channel MOS transistor 23*g* receiving block designating signal BS via an inverter 23*f* is arranged between an output node 23*e* and the ground node. The n-channel MOS transistor receiving block select signal BS on its gate is not employed. Structures other than the above are the same as those shown in FIG. 11, and the corresponding portions bear the same reference numbers, and will not be described.

In the structure of the isolation control signal generating circuit shown in FIG. 13, p-channel MOS transistor 23*g* is turned on when block select signal BS is active. P-channel MOS transistor 23*g* is turned off when the gate-source voltage goes beyond threshold voltage Vthp. Therefore, the voltage level on output node 23*e* is equal to |Vthp|, and isolation control signal φSHR can be driven to the intermediate voltage level without using intermediate voltage generating circuit 25. Since intermediate voltage generating circuit 25 is not necessary, the current consumption can be small. Further, an interconnection line for transmitting the intermediate voltage is not required, so that an area occupied by interconnection lines can be small. The ground line is commonly used by MOS transistors 23*c* and 23*g*.

By setting the threshold voltage of p-channel MOS transistor 23*g* to an appropriate value, e.g., by ion implantation, the intermediate voltage at a desired voltage level can be obtained depending on the voltage level of sense amplifier power supply voltage Vccc.

Structure 3 of Isolation Control Signal Generating Circuit

Figure 14A:
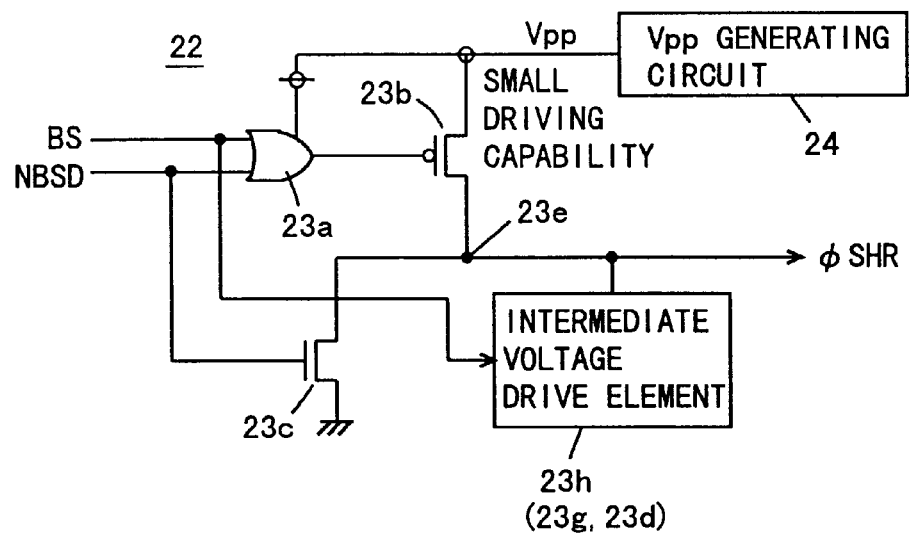
FIG. 14A shows still another structure of the isolation control signal generating circuit shown in FIG. 10.
Figure 14B:
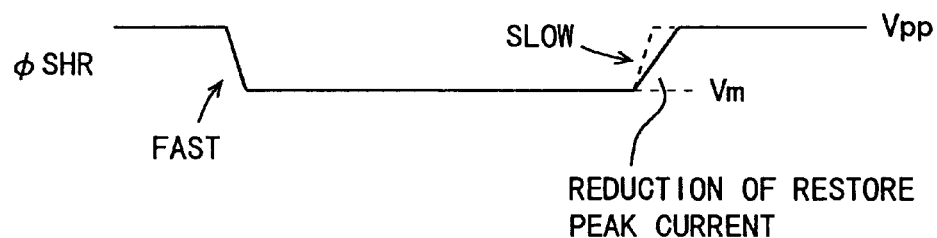
FIG. 14B shows an operation waveform thereof.

FIG. 14A shows a structure 3 of isolation control signal generating circuit 22 (22l, 22r) shown in FIG. 10. In the structure shown in FIG. 14A, the current driving capability of p-channel MOS transistor 23b for driving isolation control signal φSHR to high voltage Vpp level is reduced. An intermediate voltage drive element 23h drives isolation control signal φSHR to intermediate voltage Vm level when block select signal BS is active, and corresponds to MOS transistor 23d shown in FIG. 11 or p-channel MOS transistor 23g shown in FIG. 13.

In the structure of the isolation control signal generating circuit shown in FIG. 14A, isolation control signal φSHR is rapidly lowered from high voltage Vpp level to intermediate voltage Vm level for shortening the access time. Thereby, delay in word line select timing is prevented.

In the restoring operation, which is performed before driving a selected word line to the inactive state after completion of a memory access, p-channel MOS transistor 23b relatively slowly raises isolation control signal φSHR from intermediate voltage Vm to high voltage Vpp level. This can prevents abrupt connection of the bit line load to the sense nodes of the sense amplifier circuit, and an abrupt flow of a large charging current of the sense amplifier can be prevented. This prevents lowering of the sense amplifier power supply voltage during the restore operation, and therefore prevents lowering the voltage level of the H-level data to be restored into the memory cell.

By slowly connecting a relatively large load to the sense nodes of the sense amplifier, the charging current flows relatively slowly so that lowering of the sense amplifier power supply voltage can be prevented (because the peak current can be dispersed).

Structure 4 of Isolation Control Signal Generating Circuit

Figure 15:
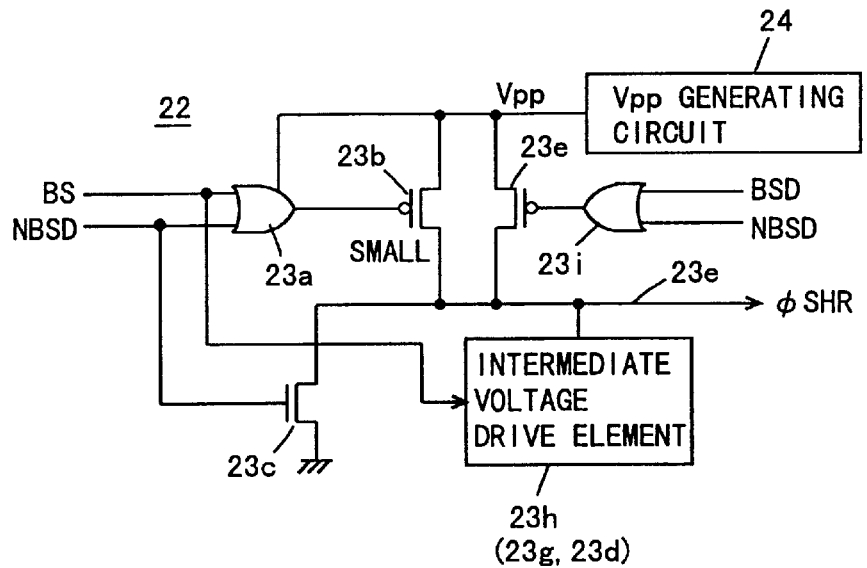
FIG. 15 shows yet another structure of the isolation control signal generating circuit shown in FIG. 10.
Figure 22:
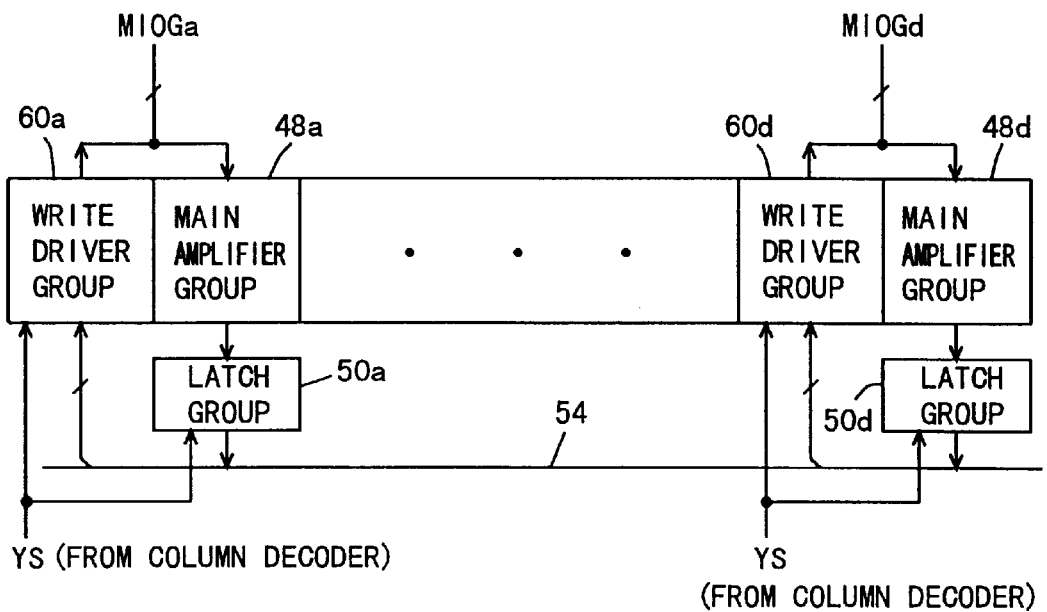
FIG. 22 shows a modification of the embodiment 2 of the invention.

FIG. 15 schematically shows a structure 4 of isolation control signal generating circuit 22 shown in FIG. 22. The isolation control signal generating circuit shown in FIG. 15 differs from isolation control signal generating circuit shown in FIG. 14A in the following point. In the structure of FIG. 15, there are additionally provided an OR circuit 23i receiving block designating signals BSD and NBSD, and a p-channel MOS transistor 23a turned on to transmit high voltage Vpp from Vpp generating circuit 24 to output node 23e when the output signal of OR circuit 23i is at L-level. Block select signals BSD and NBSD are fall-delayed signals of block select signals BS and NBS, respectively. Accordingly, the timing at which MOS transistor 23j changes from OFF state to ON state is delayed behind that of MOS transistor 23b by the delay time of block select signals BSD and NBSD. The operation of the isolation control signal generating circuit shown in FIG. 15 will now be described with reference to FIGS. 16A and 16B.

Figure 16A:
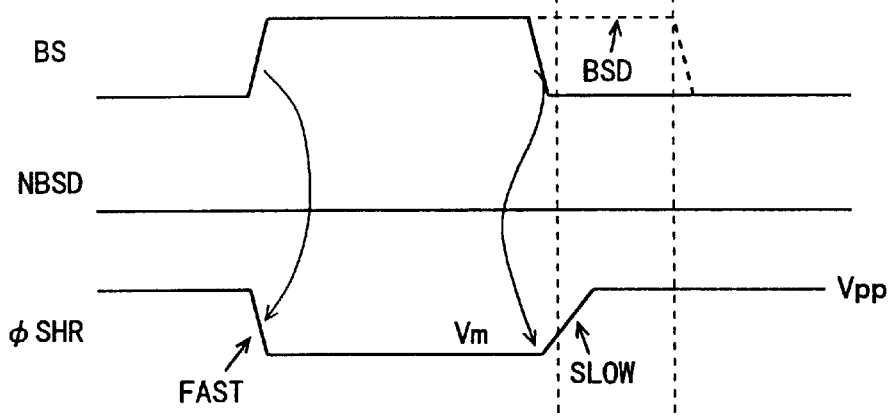
FIGS. 16A and 16B are signal waveform diagrams representing operation of the isolation control signal generating circuit shown in FIG. 15.

Referring first to FIG. 16A, when block select signal BS is driven to the selected state, both the output signals of OR circuits 23a and 23i attain H-level, and MOS transistors 23b and 23i are turned off. Intermediate voltage drive element 23h drives isolation control signal φSHR to the voltage level of intermediate voltage Vm. In this case, isolation control signal φSHR is driven rapidly to the intermediate voltage level.

When block select signal BS is driven to the unselected state, the output signal of OR circuit 23a attains L-level, and MOS transistor 23b is turned on. However, OR circuit 23i generates the output signal at H-level because block select signal BSD is at H-level, and MOS transistor 23j maintains the OFF state. Therefore, output node 23e is driven to high voltage Vpp level via MOS transistor 23b. Since MOS transistor 23b has a relatively small current driving capability, the rising speed of isolation control signal φSHR is slow in the restore operation, and the bit line having a large drive load is connected relatively slowly to the sense node of the sense amplifier, so that the peak current during restoring is suppressed.

In an initializing operation, isolation control signal φSHR is already at high voltage Vpp level, and the output signal of OR circuit 23i attains L-level in accordance with the L-level of block select signal BSD, and does not change its voltage level even when MOS transistor 23j is turned on.

Figure 16B:
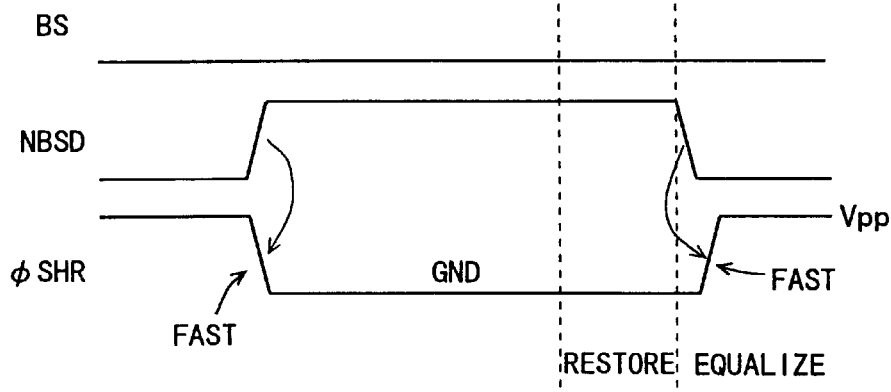

Then, as shown in FIG. 16B, adjacent block designating signal NBS may be driven to the selected state. In this case, both OR circuits 23a and 23i generate the output signals at H-level so that MOS transistors 23b and 23j are turned off, and MOS transistor 23c is turned on. Thereby, isolation control signal φSHR is rapidly driven to the ground voltage level.

In the restoring operation, restoring is effected on the adjacent memory sub-block in accordance with change of adjacent block designating signal NBS to the inactive state. In this state, delayed adjacent block designating signal NBSD is at H-level so that both OR circuits 23a and 23i generate signals at H-level, and MOS transistors 23b and 23g maintain the OFF state. When equalizing operation starts after completion of restoring in the adjacent memory sub-block, delayed adjacent block designating signal NBSD falls to L-level, and the output signals of OR circuits 23a and 23i attain L-level. Thereby, MOS transistor 23c is turned off, and MOS transistors 23b and 23j are turned on. Output node 23e is driven by two MOS transistors 23b and 23j, and isolation control signal φSHR is rapidly driven from the ground voltage to high voltage Vpp level. Isolation control signal φSHR can be driven to high voltage Vpp level in the equalizing operation, and a so-called RAS precharge time can be reduced. When corresponding memory sub-blocks are both unselected, both block designating signals BS and NBS are at L-level, and isolation control signal φSHR maintains the level of high voltage Vpp.

By utilizing the isolation control signal generating circuit shown in FIG. 15, a selected isolating gate group can be slowly changed to the low-resistance state only in the restore operation. In the equalizing operation, the isolating gate group in the OFF state can be rapidly driven to the low-resistance ON state. The restore operation with a low current consumption can be achieved without increasing the so-called RAS precharge time. In the equalizing operation, the sense amplifier is already inactive, so that the charging/discharging current does not flow through the sense amplifier even when isolation control signal φSHR is driven to high voltage Vpp level. Only electric charges stored in the sense nodes are transmitted through the equalize circuit to equalize the voltage levels on the respective bit lines.

The current driving capability of MOS transistors 23b and 23j can be appropriately adjusted merely by selecting an appropriate size (ratio of gate width to gate length), considering the rising speed of isolation control signal φSHR.

Array Structure

FIG. 17 schematically shows an arrangement of the isolation control circuits, and shows the arrangement of the isolation control circuits for memory sub-blocks MSB10, MSB11, MSB00 and MSB01 arranged in two rows and two columns. Isolation gate groups 2-0R and 2-0L are arranged on opposite sides of memory sub-block MSB00. Isolation gate groups 2-1R and 2-1L are arranged on the opposite sides of memory sub-block MSB10. A sense amplifier group 1-0 is arranged between isolating gate groups 2-0L and 2-1R, and sense amplifier group 1-1 is arranged between isolating gate groups 2-2R and 2-1L.

Sense amplifier sub-bands SSB1 and SSB2 are arranged for memory sub-block MSB11, and sense amplifier sub-bands SSB1 and SSB0 are arranged for memory sub-block MSB01. Each of sense amplifier sub-bands SSB (SSB0–SSB2) includes two isolating gate groups as well as a sense amplifier group arranged between these two isolating gate groups.

In region AR between blocks, a sub-word driver SW0 is arranged between memory sub-blocks MSB00 and MSB01, and sub-word driver SW1 is arranged between memory sub-blocks MSB10 and MSB11.

Sub-word drivers SW0 and SW1 drive the sub-word lines included in the corresponding memory sub-blocks to the selected state in accordance with the signals on the main word lines (not shown). The structure shown in FIG. 17 employs the hierarchical word line structure including main- and sub-word lines.

On one side of the memory mat, isolation control circuits 22-0R, 22-0L, 22-1R, 22-1L and 22-2R are arranged corresponding to isolating gate groups 2-0R, 2-0L, 2-1R, 2-1L and 2-2R, respectively. Row decode circuits 30-0 and 30-1 aligned with these isolation control circuits are arranged corresponding to memory sub-blocks MSB00 and MSB10. Row select signals from row decode circuits 30-0 and 30-1 are transmitted onto sub-word drivers SW0 and SW1 via main word lines (not shown).

Isolation control circuits 22-0R, 22-0L, 22-1R, 22-1L and 22-2R generate isolation control signals φSHR0R, φSHR0L, φSHR1R, φSHR1L and φSHR2R, respectively. In accordance with the isolation control signals from isolation control circuits 22-0R, 22-0L, 22-1R, 22-1L and 22-2R, corresponding isolating gate groups 2-0R, 2-0L, 2-1R, 2-1L and 2-2R are controlled of ON and OFF states as well as of the high-resistance ON state and low-resistance ON state.

Row block designating signal BS0 is applied to isolation control circuits 22-0R, 22-0L and 22-1R. Row block designating signal BS1 is applied to isolation control circuits 22-0L, 22-1R, 22-1L and 22-2R. Isolation control circuits 22-1L and 22-2R also receive row block designating signal BS2. Row block designating signal BS0 selects memory sub-blocks MSB00 and MSB01, and row block designating signal BS1 selects memory sub-blocks MSB10 and MSB11. In accordance with row block designating signals BS0 and BS1 as well as BS2 and BSj, the memory sub-blocks aligned in the row direction are driven to the selected state.

Isolation control circuits 22-0R–22-2R receive row block designating signals BS0, BS1 and BS2 as block designating signal BS and adjacent block designating signal NBS, and execute the control operations. For example, isolation control circuit 22-1R receives row block designating signal BS1 as block designating signal BS, and receives row block designating signal BS0 as adjacent block designating signal NBS. The structures of isolation control circuits 22-0R–22-2R are the same as those already described, and include delay circuits for delaying the falling (deactivation) of row block designating signals BS0, BS1, BS2 and BSi by a predetermined time, respectively.

As shown in FIG. 17, isolation control circuits 22-0R–22-2R, which are located on one side of the memory mat and are aligned with row decode circuits 30-0 and 30-1, are arranged close, facing and common to the isolating gate groups in the corresponding row blocks, respectively. Thereby, the isolation control signals can be produced while efficiency utilizing empty regions.

Although not shown clearly in FIG. 17, the sense amplifier groups 1-0 and 1-1 as well as the sense amplifier groups, included in sense amplifier sub-bands SSB0–SSB2 receive sense amplifier activating signals (φSON and φSOP) from the sense amplifier control circuits aligned with decode circuits 30-0 and 30-1.

According to the embodiment 1 of the invention, as described above, when a memory sub-block is selected in the structure employing the shared sense amplifier structure, a sense amplifier group and a corresponding memory sub-block coupled through a gate in the high-resistance ON state, and this state is held until the memory sub-block is driven to the unselected state. Therefore, the sensing operation can be performed fast with a low current consumption. While the memory sub-block is in the selected state, isolation control signal φSH (φSHR) is held in a constant voltage level. Therefore, such a situation can be prevented that variation in bit line isolation control signal causes variation in bit line potential due to capacitive coupling to adversely affect a sense amplifier (i.e., increase the current consumption). Accordingly, the sense amplifier group can stably hold the memory cell data.

Since the sense amplifier group is equivalently isolated from the bit line capacitance of a large load, write/read of data is effected on only the sense amplifier group, and a column selection can be performed fast for writing/reading data.

Owing to isolation of the bit line load, it is required to drive only a small load of sense nodes in the sensing operation, so that the charging/discharging current in the sensing operation is reduced, and the sensing can be accurately performed without causing sense power supply noises.

Embodiment 2

FIG. 18 schematically shows a structure of an array portion of a semiconductor memory device according to an embodiment 2 of the invention. In FIG. 18, memory mat MM# includes a plurality of memory sub-blocks MSB arranged in rows and columns. Memory sub-blocks MSB aligned in the row direction form row block R#i (i=0–m), and memory sub-blocks MSB aligned in the column direction form a column block C#j (j=0–n). In memory mats MM#, the memory sub-blocks are arranged in the same manner as those shown in FIG. 3.

In regions AR0 and ARn+1 outside the memory array as well as regions AR1–ARn between memory blocks, there are arranged main column select lines SGa and SGb for transmitting column select signals from a column decoder (not shown). Column select lines SGa and SGb extend only in the column direction, and each are shared by the memory sub-blocks in a corresponding column block.

For each memory sub-block MSB, local column select lines LSGa and LSGb are arranged. These local column select lines LSGa and LSGb extend in the row direction and are arranged only within the region containing corresponding memory sub-block. Local column select lines LSGa and LSBb are connected to corresponding memory column select lines SGa and SGb via decoders DEC arranged in regions AR0 and ARn+1 outside the array as well as regions AR1–ARn between memory blocks.

In each of column blocks C#0–C#n, memory I/O line pairs MIOG0–MIOGn extend in the column direction over memory sub-blocks MSB. A plurality of columns (sense amplifiers) simultaneously selected by local column select lines LSGa and LSGb are connected to the corresponding main I/O line pair group.

Main column select lines SGa and SGb are connected only to decoder DEC, and are not connected to an I/O gate (column select gate) for selecting a memory cell column. Therefore, the load capacitance of SGa and SGb are small, and the column select signal can be transmitted fast to the remotest end of memory mat MM#.

By arranging the main I/O line pairs over the memory sub-blocks, a required number of main I/O line pairs can be arranged for increasing the data bit number without increasing an area occupied by memory mat MM#.

In regions AR1–ARn between blocks and regions AR0 and ARn+1 outside the block, sub-word line drivers may be arranged, or word line shunt may be provided.

Figure 19:
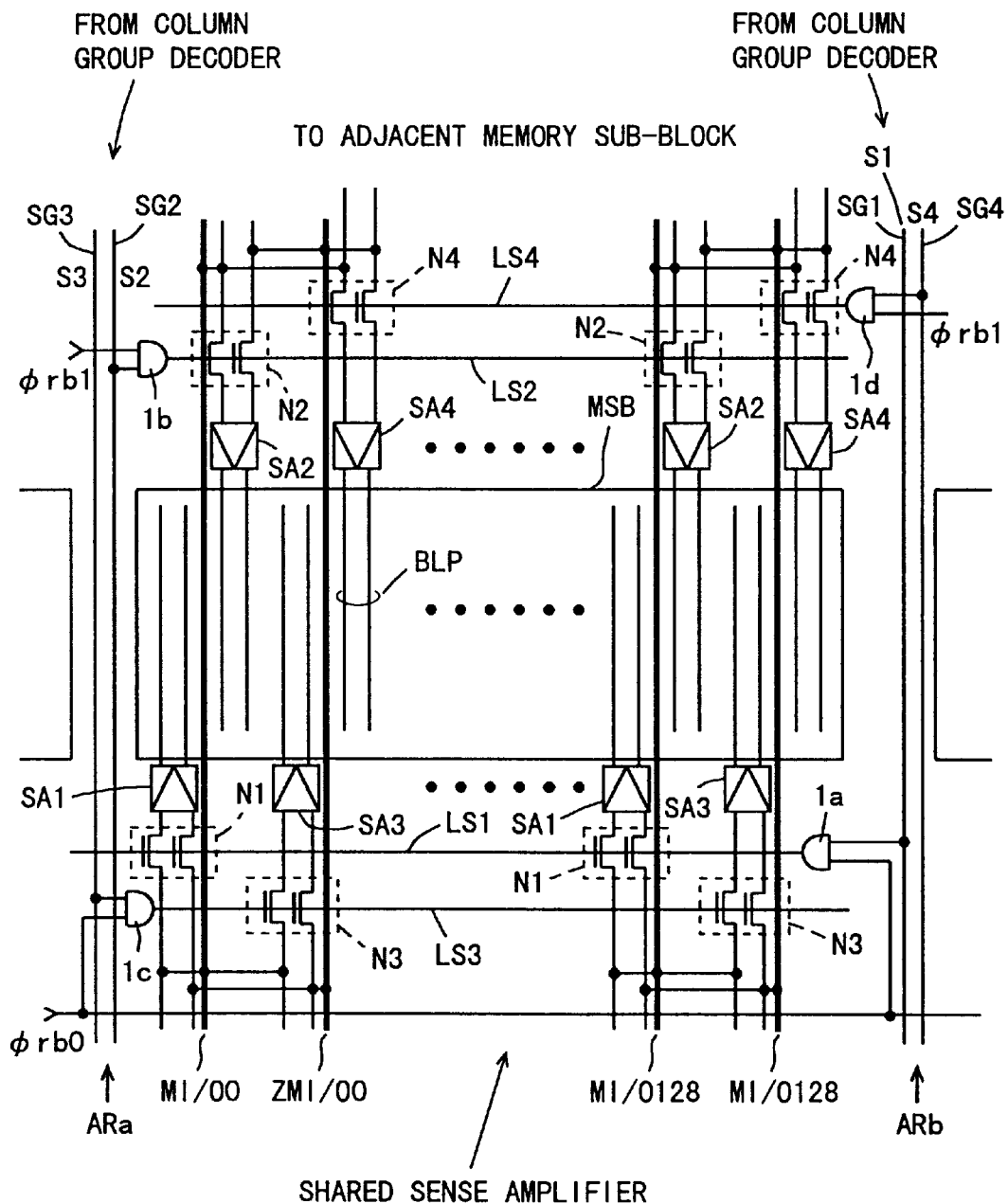
FIG. 19 schematically shows a structure of a sense amplifier band in the memory mat arrangement shown in FIG. 18.

FIG. 19 shows a structure of a bit lie isolation group in the arrangement shown in FIG. 18. Particularly, FIG. 19 shows the arrangement for one memory sub-block MSB.

In the region adjacent, in the column direction, to the lower side of memory sub-block MSB, sense amplifier circuits SA1 and SA3 are arranged alternately with each other and corresponding to alternate bit line pairs BLP, respectively. In the region adjacent in the column direction, to the upper side of memory sub-block MSB, sense amplifier circuits SA2 and SA4 are arranged alternately with each other and corresponding to alternate bit line pairs BLP, respectively. For sense amplifier circuits SA1 and SA3, I/O select gates N1 and N3 are arranged, respectively. For sense amplifier circuits SA2 and SA4, I/O select gates N2 and N4 are arranged, respectively. These I/O select gates N1–N4 are arranged repetitively in the row direction.

One I/O select gate is selected in the set of I/O select gates N1–N4. A decode circuit 1a is provided for I/O select gate N1, and a decode circuit 1c is provided for I/O select gate N3. A decode circuit 1b is provided for I/O select gate N2, and a decode circuit 1d is provided for I/O select gate N4. Decode circuit 1a receives row block select signal φRB0 and column select signal S1 on column select line SG1. Row decode circuit 1c receives column select signal S3 on main column select line SG3 and row block select signal φRB0. Decode circuit 1b receives row block select signal φRB1 and column select signal S2 on main column select line SG2. Decode circuit 1d receives row block select signal φRB1 and column select signal S4 on main column select line SG4.

Main column select lines SG2 and SG3 extending in the column direction are arranged in region ARa outside the block, and main column select lines SG1 and SG4 extending in the column direction are arranged in region ARb between blocks.

A main I/O line pair MI/Oi and ZMI/Oi is arranged for each set of I/O select gate groups N1–N4. 128 main I/O line pairs are arranged in the structure shown in FIG. 19. In the arrangement shown in FIG. 19, therefore, 512 bit line pairs BLP are arranged in memory sub-block MSB, and column select signal S (i.e., one of signals S1–S4) selects and connects memory cells (sense amplifiers) of 128 bits to main I/O line pairs MI/O0 and ZMI/O0–ZMI/O128 and ZMI/O128.

Figure 20:
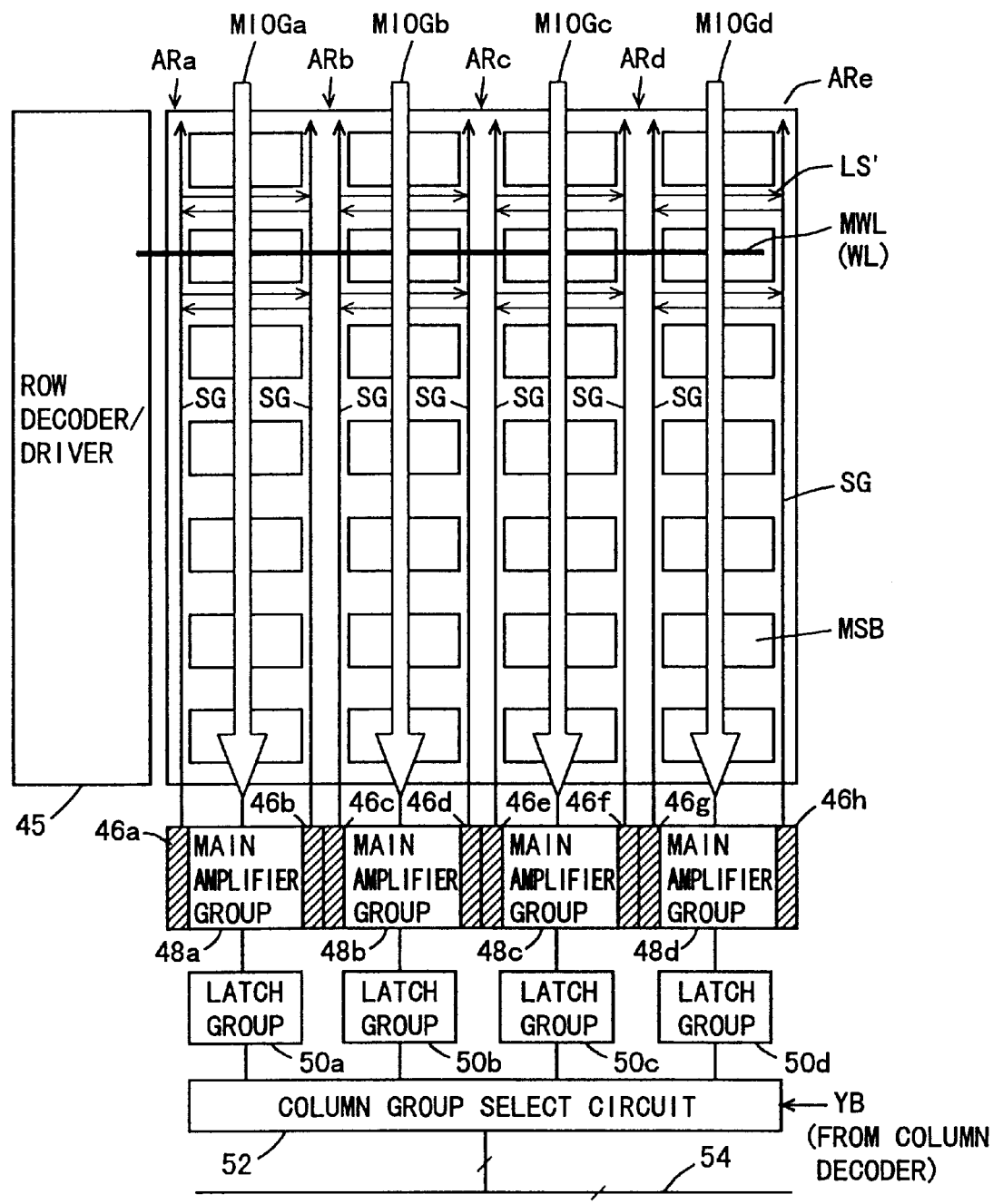
FIG. 20 schematically shows a data read circuit in the embodiment 2 of the invention.

FIG. 20 schematically shows a structure of a data read portion of the memory mat according to the embodiment 2 of the invention. In FIG. 20, memory sub-block MSB is divided into four column blocks. In regions ARb–ARd between the blocks as well as regions ARa and ARe outside the blocks, column select signals from column decoders 46a–46h are transmitted through main column select lines SG, respectively. Main amplifier groups 48a–48d are arranged corresponding to the column blocks, respectively. Main I/O line pair groups MIOGa–MIOGd extending in the column direction are arranged in the column blocks, respectively. These main I/O line pair groups MIOGa–MIOGd are arranged corresponding main amplifier groups 48a–48d, respectively, and each include main I/O line pairs connected respectively to the main amplifiers included in the corresponding main amplifier group.

Latch groups 50a–50d are arranged for main amplifier groups 48a–48d for latching data from corresponding main amplifier groups, respectively, and a column block select circuit 52 is provided for selecting a latch in latch groups 50a–50d for connection to a global data bus 50 in accordance with a column block select signal YB.

In the structure shown in FIG. 20, data is read from all the memory sub-blocks in a selected row block in accordance with a row select signal applied from a row decoder/driver 45 onto main word line MWL (or word line WL). In this case, therefore, data of, e.g., 1 Kbits are transmitted in parallel onto main I/O line pair groups MIOGa–MIOGd, and are amplified by main amplifier groups 48a–48d. Data latched by main amplifier groups 48a–48d are latched by the latches included in corresponding latch groups 50a–50d, respectively. Column group select circuit 32 simultaneously selects data of bits corresponding to a bit width of global data bus 54 in accordance with column group select signal YB. When a column is selected, the operation is merely performed to select data latched by latch groups 50a–50d, and a time for transmitting the data from the sense amplifier group via the global data bus via the main amplifier group is not required. Therefore, fast column access can be achieved.

Figure 21:
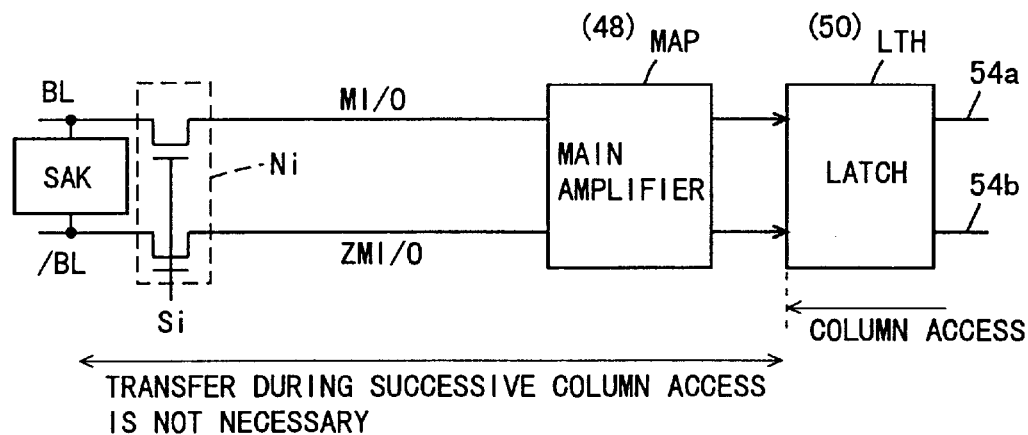
FIG. 21 schematically shows a data read circuit related to one sense amplifier circuit in the arrangement shown in FIG. 20.

FIG. 21 schematically shows a structure of a data read portion in the arrangement shown in FIG. 20. As shown in FIG. 21, sense amplifier circuit SAK is connected to main I/O line pair MI/O and ZMI/O via an I/O select gate Ni. Main I/O line pair MI/O and ZMI/O are connected to main amplifier MAP. The output of main amplifier MAP is transmitted to and latched by a latch LTH. The output of latch LTH is connected to global data bus lines 54a and 54b. Main amplifier MAP is included in main amplifier group 48, and latch LTH is included in latch group 50. Therefore, after data from sense amplifier circuit SAK is latched in latch LTH (latch group 50) via main amplifier MAP (main amplifier group 48) in the first column access, the subsequent column access is required to be performed only on latch LTH. It is not necessary to transmit data from sense amplifier circuit SAK via main I/O line pair MI/O and ZMI/O. Accordingly, fast successive column access can be achieved. In accordance with the column group select signal, data of the sense amplifiers of one column group may be selected and transmitted to the corresponding main amplifier group. In this case, a latch in the corresponding latch group is selected by the column select signal for reading the data onto the global data bus.

Modification 1

FIG. 22 shows a structure of a modification of the embodiment 2 of the invention. Similarly to the structure shown in FIG. 20, in FIG. 22 main amplifier groups 48a–48d are arranged corresponding to main I/O line pairs MIOGa–MIOGd, respectively. Latch groups 50a–50d are arranged corresponding to main amplifier groups 48a–48d for latching data amplified by corresponding main amplifier groups 48a–48d, respectively. Write driver groups 60a–60d are arranged corresponding to main amplifier groups 48a–48d, respectively. These write driver groups 60a–60d transmit the write data to main I/O line pair groups MIOGa–MIOGd, respectively. Write driver groups 60a–60d each are not provided with a latch circuit.

In the data write operation, write driver groups 60a–60d are selected in accordance with column select signal YS, and the selected write driver produces the write data from data applied via global data bus 54, and transmits the write data onto the corresponding main I/O line pair. In the data write operation, therefore, the write driver transmits the write data to a sense amplifier, and sets the latched data at the sense amplifier to the data corresponding to the write data. Sense amplifier circuit SAK is isolated from the capacitance of the corresponding bit line pair, and the write driver is merely required to drive the sense amplifier, so that fast writing can be achieved. In the data read operation, column select signal YS is applied to latch groups 50a–50d, and a selected latch transmits the data onto global data bus 54.

The number of the write drivers or the latches which are simultaneously selected by column select signal YS is appropriately determined in accordance with the bit width of global data bus 54.

Modification 2

Figure 23A:
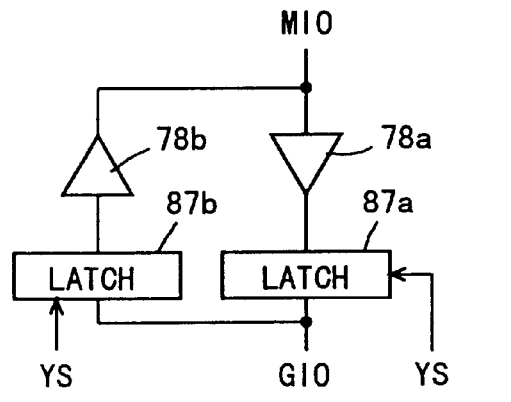
FIGS. 23A–23C show further modifications of the embodiment 2 of the invention, respectively.

FIG. 23A shows a structure of a modification 2 of the embodiment 2 of the invention. FIG. 23A shows one main amplifier 78a and one write driver 78b representatively. Write driver 78b and main amplifier 78a are coupled to main I/O line pair MIO. A latch 87a is arranged at an output of main amplifier 78a, and a latch 87b is arranged at an input of write driver 78b. Latches 87a and 87b are coupled to global data bus line pair GIO.

In the structure shown in FIG. 23A, it is merely required to access latch 87a in accordance with column select signal YS in the data read operation, and is also merely required to write data into latch 87b in accordance with column select signal YS in the data write operation. In the operation of writing data into another latch, the write driver provided for the last selected column drives main I/O line pair MIO, whereby data can be written in a pipelined manner. Therefore, fast data writing can be achieved even in the case where a long delay occurs in transmission of a data signal through main I/O line pair MIO to sense amplifier circuit SAK.

Figure 23B:
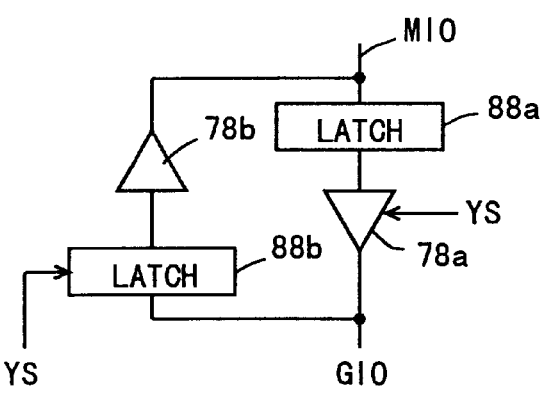

FIG. 23B shows a modification of the latch circuit. In FIG. 23B, main I/O line pair MIO is coupled to preamplifier 78a via a latch 88a. Write driver 78b is provided at its input with a latch 88b.

In data write operation of the structure shown in FIG. 23B, writing of data to latch 88b and transfer of data to a memory cell (sense amplifier circuit) by write driver 78b can likewise be performed in the pipelined manner so that fast writing can be performed. In the data read operation, it is required only to drive selectively the main amplifier 78a to the active state by column select signal YS after latch 88a latches the data signal, and it is not required to access a sense amplifier circuit for data reading. In the structure shown in FIG. 23B, therefore, writing and reading of data can be performed fast.

Figure 23C:
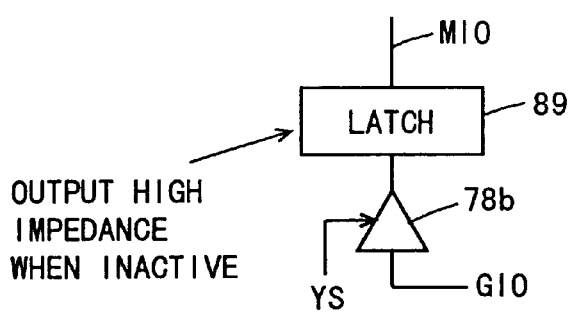

FIG. 23C shows further another structure of the latch circuit. In FIG. 23C, a latch 89 is arranged at the output of write driver 78b. Latch 89 is set to the output high-impedance state when inactive. In the structure shown in FIG. 23C, write driver 78b receives column select signal YS. While write data is being transmitted to write driver 78b, latch 89 arranged for another column can transmit the write data via main I/O line pair MIO. Therefore, data writing can likewise be performed fast (because data writing is performed in the pipelined manner, and data writing is substantially required only to the write driver). Setting latch 89 to the high impedance state when latch 89 is inactive can be easily implemented by employing an appropriate structure such as a structure using a tristate inverter buffer or a structure provided with a CMOS transmission gate at the output. Activation of the latch is performed, e.g., by a delayed signal of the write driver activating signal.

According to the embodiment 2 of the invention, as described above, the main I/O line pairs extending in the column direction are arranged over the memory sub-array blocks so that a plurality of bits of data can be simultaneously selected and transmitted to the main amplifier group. Therefore, access to the sense amplifier circuit is not required in an access operation so that fast access can be implemented. By arranging the latch at the output or input of the main amplifier, data reading can be performed in the pipelined fashion, so that data reading can be performed fast.

Further, by arranging the latch in the input or output of the write driver, it is not required to transmit the write data to the sense amplifier (in one write cycle), and access to the latch or write driver is required, and, fast data writing can be achieved.

In the structure shown in FIG. 23C, latch 89 may be reset when writing of all the data is completed, or may be simultaneously driven to the active state. In the case where the latching capability is small, and the latch data is determined by the output signal of write driver 78b, the main I/O line pair can be set to the voltage level corresponding to the write data throughout the write cycle. In this case, precharging and equalizing of the main I/O line pair are also performed after completion of data writing. Likewise, in the case where latch 89 is driven to the active state only in each clock cycle (i.e., data writing is performed in synchronization with a clock signal), data on main I/O line pair can be held at the voltage level depending on the write data (if equalizing is not performed). Any one of the above structures may be employed.

The structure wherein the latch is arranged in the preamplifier or write driver may be applied to the structure of the local and main data buses of the embodiment 1.

Embodiment 3

Figure 24:
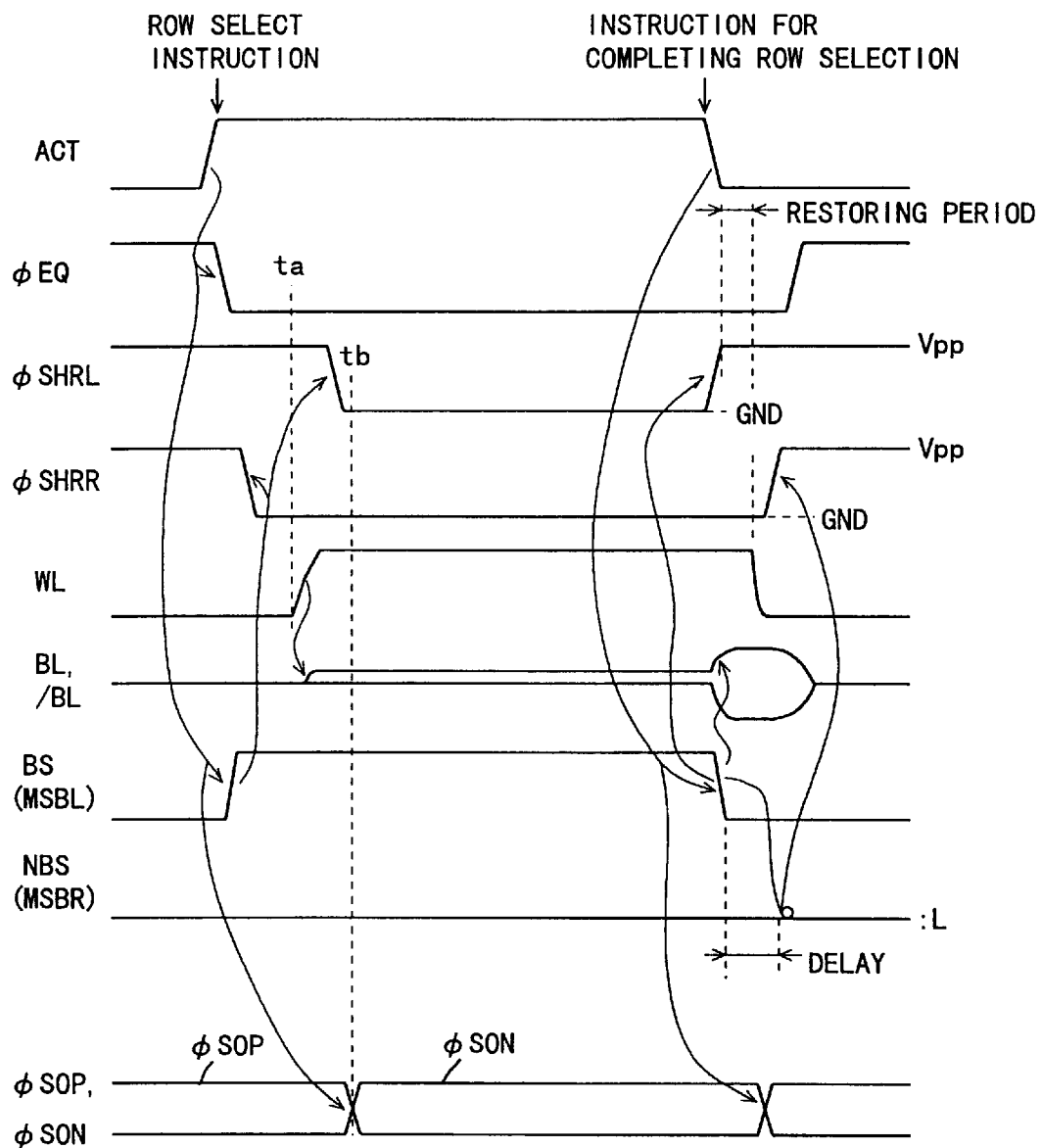
FIG. 24 is a signal waveform diagram representing operation of a semiconductor memory device according to an embodiment 3 of the invention.

FIG. 24 is a signal waveform diagram representing an operation of a semiconductor memory device according to an embodiment 3 of the invention. The memory array in this embodiment has the same structure as those shown in FIGS. 1 to 4. Operation of the embodiment 3 of the invention will now be described with reference to the signal waveform diagram of FIG. 24 and the sense amplifier band shown in FIG. 4.

When a row select instruction is applied, array activating signal ACT is driven to the active state at H-level. In response to activation of array activating signal ACT, equalize instructing signal φEQ attains the inactive state at L-level, and equalizing of each of bit line pairs BLPL and BLPR is completed. Then, block selection is performed in accordance with a block address, and block designating signal BS is driven to the selected state at H-level. Adjacent block designating signal NBS maintains the unselected state at L-level. In response to the activation of block select signal BS, bit line isolation control signal φSHRR for the adjacent block attains L-level, and isolating gate BIGR included in bit line isolating gate group 2R is turned off so that sense amplifier circuit SAK is isolated from corresponding bit line pair BLPR. Isolation gate group 2L provided for memory sub-block MSBL connects sense amplifier circuit SAK to bit line BLPL in response to H-level of isolation control signal φSHRL. Then, row selection is performed, and word line WL corresponding to an addressed row is driven to the selected state. The data of memory cell connected to the selected word line WL is read onto bit line pair BLPL (bit lines BL and /BL) at time ta.

When the memory cell data is transmitted to corresponding sense amplifier circuit SAK, isolation control signal φSHRL is driven from high voltage Vpp level to ground voltage GND level. Thereby, isolating gate group 2L is turned off, and memory sub-block MSBL is isolated from sense amplifier group 1. Each sense amplifier circuit SAK has already received read memory cell data. In this state, sense amplifier activating signals φSON and φSOP are successively activated at time tb, whereby the sense amplifiers rapidly perform the sensing operation to amplify and latch the memory cell data. Since bit line pair BLPL (BL and /BL) is isolated from sense amplifier circuit SAK, the voltage level on bit line pair BLPL maintains the same state as that during data reading.

While sense amplifier activating signals φSON and φSOP are at the active state, a column selection is performed in accordance with a column address, and data is written into or read from sense amplifier circuit SAK corresponding to the selected column.

When an instruction for completing the row selection is applied, block designating signal BS is driven to the unselected state. In response to deactivation of block designating signal BS, isolation control signal φSHRL rises from L-level of ground voltage GND to H-level of high voltage Vpp. Thereby, bit line isolating gate group 2L is turned on to couple sense amplifier group 1 to memory sub-block MSBL. Each bit line pair BLPL is driven by corresponding sense amplifier circuit SAK, and data latched in sense amplifier circuit SAK is written into the memory cell connected to the selected word line. In this manner, restoring is effected on the memory cell.

When the restoring is completed, word line WL is driven to the unselected state, and then sense amplifier activating signals φSON and φSOP are driven to the inactive state. Then, isolation control signal φSHRR is driven to high voltage Vpp level. Thereby, equalizing and precharging are executed on bit line pairs BLPR and BLPL of memory sub-blocks MSBR and MSBL.

As shown in FIG. 24, the selected memory sub-block is connected to sense amplifier group 1 when instruction of completing the row selection is applied. Thereby, the restoring can be performed within a so-called RAS precharge time. While array activating signal ACT is active, sense amplifier circuit SAK is isolated from the corresponding bit line pair, and the load on the latch nodes (sense nodes) of sense amplifier circuit SAK is small. In the data write operation, it is merely required to write the data only to the sense amplifier, and it is not necessary to write the data onto the selected bit line pair of the memory sub-block. Therefore, the time required for data writing can be short (see FIGS. 8, 22, 23A and 23B). Likewise, in the data read operation, the sense amplifier group is completely isolated from the selected memory sub-block. Therefore, the load to be driven by each sense amplifier circuit SAK is small, and the sensing operation can be performed faster, so that data reading (column selection) can be performed at an earlier timing, and data reading can be performed fast.

Isolation control signal φSHRL can be driven from high voltage Vpp level to ground voltage GND level at any timing, provided that memory cell data is already transmitted to the latch nodes (sense nodes) of the sense amplifier circuit, and the voltage difference which can be sensed is already present between the sense nodes of the sense amplifier circuit. The timing for starting the sensing may be equal to the timing (time tb) for driving isolation control signal φSHRL to ground voltage GND level. During successive access, bit line pair BLPL is held in the electrically floating state. Even when the voltage level of a selected memory cell data varies, e.g., due to a leak current, the sense amplifier circuit performs the restoring when the row selection is completed. Accordingly, the memory cell data is reliably restored, and therefore no problem occurs.

Figure 25:
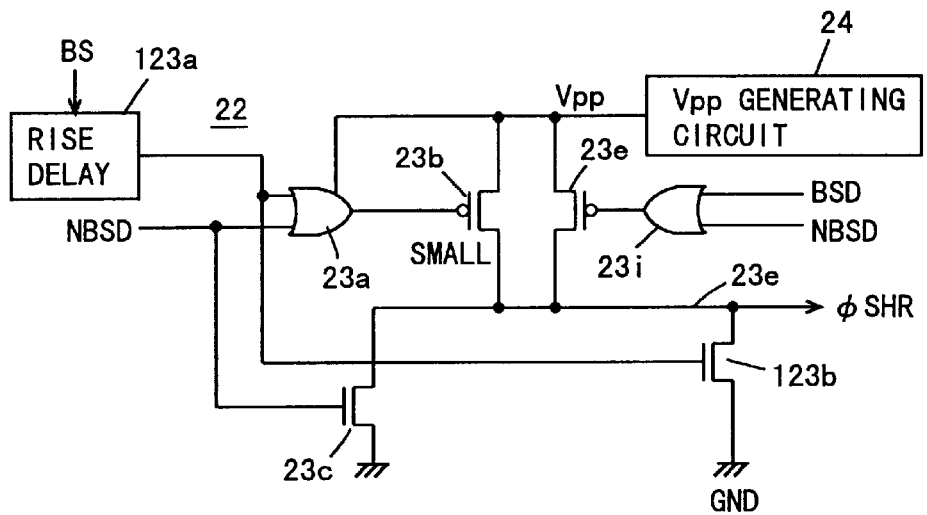
FIG. 25 shows a structure of a main portion of the embodiment 3 of the invention.

FIG. 25 schematically shows a structure of a portion generating the bit line isolation control signal in the embodiment 3 of the invention. The bit line isolation control circuit corresponds to isolation control signal generating circuits 22l and 22r shown in FIG. 10. Isolation control signal generating circuit 22 shown in FIG. 25 differs from the isolation control signal generating circuit shown in FIG. 15 in the following point. OR circuit 23a receives an output signal of a rise delay circuit 123a delaying rising (activation) of block designating signal BS by a predetermined time. Output signal line 23e is provided with an n-channel MOS transistor 123b, which is turned on, in response to H-level (activation) of the output signal of rise delay circuit 123a, to drive output signal line 23e to ground voltage GND level. Structures other than the above are the same as those shown in FIG. 15, and the corresponding portions bear the same reference numerals, and will not be described in detail. Operation of isolation control signal generating circuit 22 shown in FIG. 25 will now be described below with reference to signal waveforms shown in FIGS. 26A and 26B.

Figure 26A:
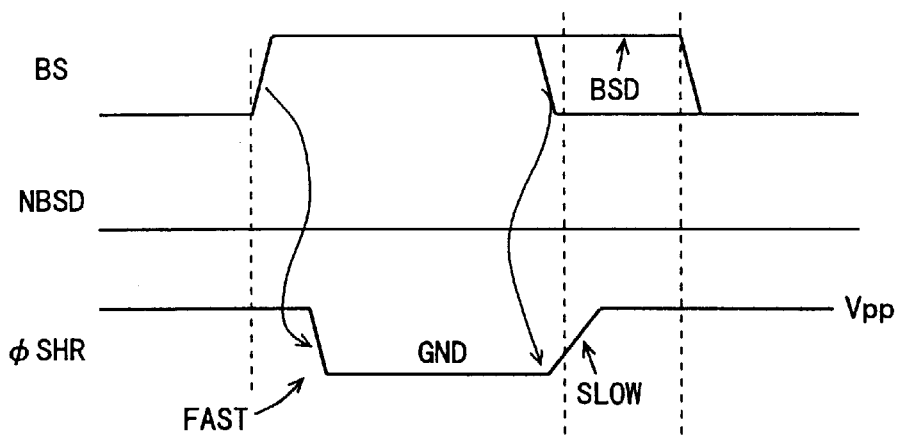
FIGS. 26A and 26B are signal waveform diagrams representing operation of the circuit shown in FIG. 25.

Referring to FIG. 26A, description will now be given of the operation performed when block select signal BS is driven to the selected state. When block select signal BS is driven to the selected state, rise delay circuit 123a delays the rising of block select signal BS by a predetermined time. Adjacent block designating signal NBSD maintains the inactive state at L-level. During a period of the delay time of rise delay circuit 123a, therefore, the output signal of OR circuit 23a is at L-level, p-channel MOS transistor 23b maintains the ON state, and isolation control signal φSHR maintains high voltage Vpp level.

When the delay time of rise delay circuit 123a elapses, the output signal of rise delay circuit 123a rises to H-level, and the output signal of OR circuit 23a attains H-level, to turn off p-channel MOS transistor 23b. In response to the rising of output signal of rise delay circuit 123a, n-channel MOS transistor 123b is turned on, and isolation control signal φSHR is driven to ground voltage GND level. Since MOS transistor 123b has a large driving capability, isolation control signal φSHR is rapidly driven from high voltage Vpp level to ground voltage GND level.

When block designating signal BS is driven to the unselected state, the output signal of rise delay circuit 123a likewise attains L-level, and n-channel MOS transistor 123b is turned off. The output signal of OR circuit 23a attains L-level, and p-channel MOS transistor 23b is turned on so that p-channel MOS transistor 23b having a small driving capability drives isolation control signal φSHR to high voltage Vpp level. At this time, the output signal of OR circuit 23a is at H-level (owing to delayed isolation control signal BSD), and MOS transistor 23e maintains the OFF state.

During the above period, restoring of the memory cell data is executed. When the restoring is completed, the output signal of OR circuit 23a attains L-level (delayed isolation control signal BSD attains L-level), and p-channel MOS transistor 23e is turned on.

Figure 26B:
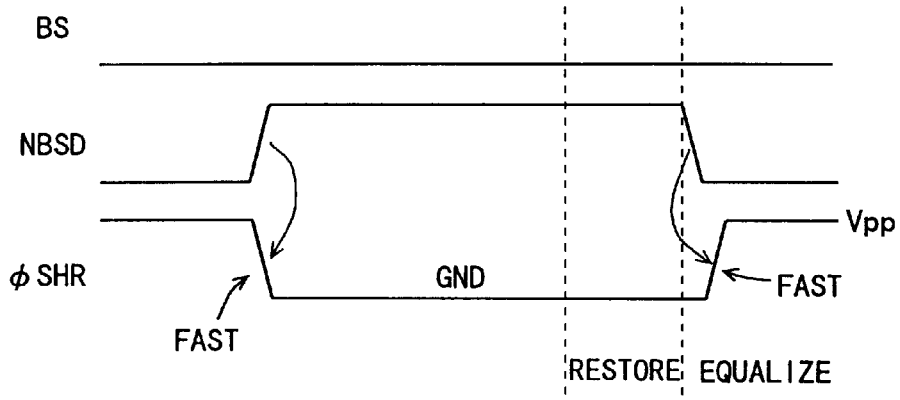

Referring to FIG. 26B, description will now be given of the operation in the case where adjacent block designating signal NBS is driven to the selected state. When adjacent block designating signal NBS is driven to the selected state, delayed adjacent block designating signal NBSD, or the fall delayed signal, rises to H-level in synchronization with rising of adjacent block designating signal NBS. Responsively,, the output signals of OR circuits 23a and 23i attain H-level, and p-channel MOS transistors 23b and 23e are turned off. N-channel MOS transistor 23c is turned on, and isolation control signal φSHR is rapidly driven from high voltage Vpp level to ground voltage GND level.

After the row selection is completed, delayed block designating signal NBSD maintains H-level while restoring is being performed for the adjacent sub-block. During this period, n-channel MOS transistor 23c is ON, and isolation control signal φSHR maintains the ground voltage level.

When the restoring period expires, delayed block designating signal NBSD falls to L-level, and the output signals of OR circuits 23a and 23i attain L-level. Responsively, both p-channel MOS transistors 23b and 23e are turned on, and n-channel MOS transistor 23c is turned off, so that isolation control signal φSHR is rapidly driven to high voltage Vpp level. Accordingly, by utilizing the rise-delayed signal of block designating signal BS as shown in FIG. 25, the sensing operation can be performed with the sense amplifier isolated from the bit line pair.

As another structure of generating isolation control signal φSHR, a structure similar to that shown in FIG. 11 may be utilized. In this structure, an isolation control signal generating circuit which is similar to that shown in FIG. 11 utilizes the rise-delayed block designating signal instead of block designating signal BS, and also utilizes the ground voltage instead of the intermediate voltage generating circuit.

Modification 1

Figure 27:
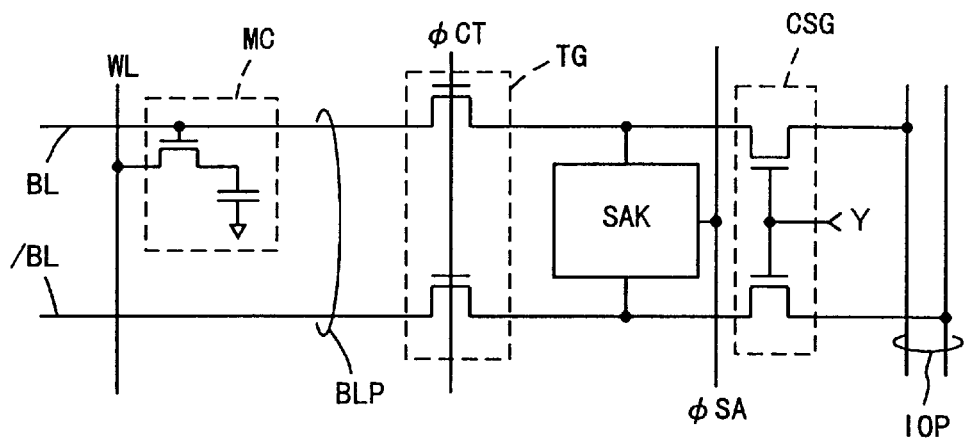
FIG. 27 schematically shows a structure of a modification of the embodiment 3 of the invention.

FIG. 27 schematically shows a structure of a modification 1 of the embodiment 3 of the invention. In FIG. 27, sense amplifier circuit SAK is provided for one memory block. Thus, the shared sense amplifier structure is not employed. Transfer gate TG is arranged between sense amplifier circuit SAK and bit line pair BLP. Memory cell is arranged corresponding to the crossing between bit line pair BLP and word line WL. The sense nodes of sense amplifier circuit SAK are connected to an internal data line pair IOP via column select gate CSG.

Figure 28:
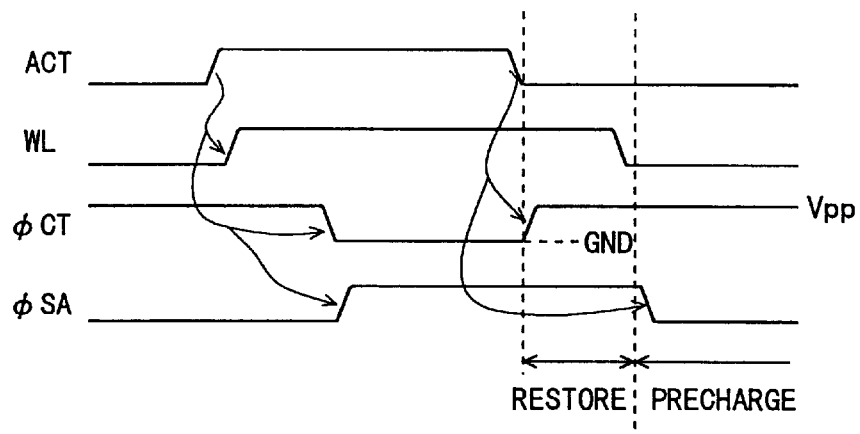
FIG. 28 is a signal waveform diagram representing an operation of the circuit shown in FIG. 27.

Transfer gate TG is turned on in response to transfer control signal φCT, and column select gate CSG is turned on in response to a column select signal Y from a column decoder (not shown). The operation of the circuit shown in FIG. 27 will now be described with reference to a signal waveform diagram of FIG. 28.

When a row select instruction is applied, array activating signal ACT is driven to the active state. In accordance with the activation of array activating signal ACT, word line WL corresponding to an addressed row is driven to the selected state. Transfer control signal φCT is at high voltage Vpp level during standby, and maintains high voltage Vpp level during the operation of selecting the word line. When the data of memory cell MC is transmitted to sense amplifier circuit SAK and the voltage difference between the sense nodes of sense amplifier circuit SAK sufficiently increases, transfer control signal φCT is driven to ground voltage GND level. Thereby, sense amplifier circuit SAK is isolated from bit lines BL and /BL of bit line pair BLP. In this state, sense amplifier activating signal φSA is activated, and sense amplifier circuit SAK performs the sensing. At this time, the sense nodes of sense amplifier circuit SAK are isolated from bit lines BL and /BL and have the load small, and the sensing operation can be performed fast.

When the sensing operation of sense amplifier circuit SAK is completed, a column selection is performed while holding transfer control signal φCT at L-level, and column select gate CSG is selected, and bit line pair BLP corresponding to the selected column is connected to internal data line pair IOP.

When the row selection is completed, array activating signal ACT is driven to the inactive state at L-level. In response to deactivation of array activating signal ACT, transfer control signal φCT is driven to high voltage Vpp level, and sense amplifier circuit SAK is connected to bit line pair BLP. Sense amplifier circuit SAK drives bit lines BL and /BL in accordance with the latched data to perform restoring of data into memory cell MC. When this restoring is completed, selected word line WL is driven to the unselected state, and then sense amplifier activating signal φSA is driven to the inactive state. Then, bit lines BL and /BL are precharged and equalized to the predetermined precharge voltage level.

In the non-shared sense amplifier structure shown in FIG. 27, a transfer gate for transferring charges is arranged between the sense amplifier circuit and bit line pair BLP, similarly to the foregoing structure. Thereby, the load on the sense amplifier circuit during the sensing operation can be reduced, and the sensing operation can be performed fast.

Figure 29:
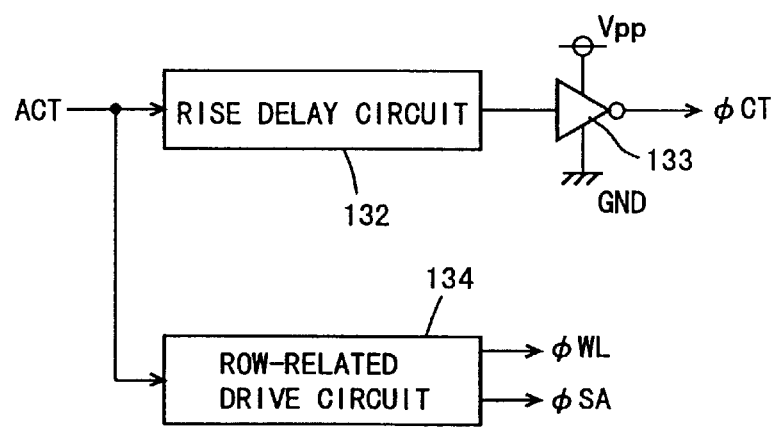
FIG. 29 schematically shows a structure of a circuit generating a transfer control signal shown in FIG. 27.

FIG. 29 schematically shows a structure of a portion for generating the sense control signal. The transfer control signal generating portion shown in FIG. 29 includes a rise delay circuit 132 for delaying rising (activation) of array activating signal ACT by a predetermined time, and an inverter circuit 133 for producing transfer control signal φCT by inverting the output signal of rise delay circuit 132. Inverter circuit 133 operates using high voltage Vpp and ground voltage GND as the operation power supply voltages, and generates a signal at high voltage Vpp level when the output signal of rise delay circuit 132 is at L-level.

In accordance with array activating signal ACT, a row-related drive circuit 134 produces a signal φWL driving word line WL and sense amplifier activating signal φSA. Row-related drive circuit 134 for producing word line drive signal φWL and sense amplifier activating signal φSA can be easily implemented by using a delay circuit delaying array activating signal ACT.

In the non-shared sense amplifier structure shown in FIG. 27, a transfer control signal φCT may be adapted to be held at the level of intermediate voltage Vm, similarly to that of the embodiment 1.

According to the embodiment 3 of the invention, as described above, the sense amplifier circuit is isolated from the bit line pair in the sensing operation. Therefore, the load on the sense amplifier is reduced, and the sensing operation can be performed fast. When the row selection is completed, the sense amplifier circuit and the bit line pair are connected for restoring the memory cell data. In the data write operation, therefore, it is merely required to access the sense amplifier circuit, and it is not necessary to write data into memory cell. Accordingly, the load on the write circuit is reduced, and fast writing can be achieved.

Another Example of Application

The precharge voltage of the bit line may be different from intermediate voltage Vcc/2 and, for example, may be ground voltage Vss. The voltage level of intermediate voltage Vm for control is appropriately determined depending on the precharge voltage Vbp of the bit line (Vm~Vbp+Vth+ΔV).

According to the invention, as described above, a bit line pair is connected to a corresponding sense amplifier via an isolating gate in the high-resistance ON state upon operation of the sense amplifier. Therefore, the load on the sense amplifier is reduced so that the sensing operation can be performed fast with a low current consumption, and the access time can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory sub-blocks each having a plurality of memory cells arranged in rows and columns, and aligned at least in a column direction;
   a plurality of sense amplifier groups arranged for said plurality of memory sub-blocks such that memory sub-blocks adjacent each other in the column direction share a sense amplifier group, each sense amplifier group activated to sense and amplify data of a selected memory cell in a corresponding memory sub-block;
   a plurality of isolating gate groups arranged between said plurality of sense amplifier groups and said plurality of memory sub-blocks for selectively isolating corresponding sense amplifier groups from corresponding memory sub-blocks, respectively; and
   control circuitry responsive to a row select instruction for setting a selected isolating gate group provided for a selected memory sub-block including the selected memory cell to a high-resistance but conductive state, setting an unselected isolating gate group arranged between an unselected memory sub-block sharing the sense amplifier group with said selected memory sub-block and the shared sense amplifier group to a non-conductive state, and holding the conductive state and the non-conductive state while said selected memory sub-block is in a selected state.

2. The semiconductor memory device according to claim 1, wherein
   said control circuitry includes a circuit for setting said selected isolating gate group to a low-resistance and conductive state in response to an instruction of completing a row select operation.

3. The semiconductor memory device according to claim 2, wherein
   said control circuitry further includes a circuit responsive to said instruction of completing the row select operation for setting said unselected isolating gate group to said low-resistance and conductive state at a timing behind transition of said selected isolating gate group to said low-resistance, conductive state.

4. The semiconductor memory device according to claim 1, wherein each of said plurality of isolating gate groups includes insulated gate field effect transistors provided corresponding to the respective columns in a corresponding memory sub-block, and
   said control circuitry includes a circuit responsive to said row select instruction and a memory block designating signal for applying a control signal at a voltage level intermediate an operation power supply voltage and a ground voltage to gates of the insulated gate field effect transistors of said selected isolating gate group for achieving said high-resistance but conductive state, and responsive to an instruction of completing the row select operation for applying the control signal at a raised voltage level higher than said operation power supply voltage to the gates of the insulated gate field effect transistors in said selected isolating gate group for achieving a low-resistance and conductive state.

5. The semiconductor memory device according to claim 1, wherein
   said control circuitry includes a plurality of isolation control circuits provided corresponding to said plurality of isolating gate groups, respectively, each for producing an isolation control signal for a corresponding isolating gate group in accordance with a block designating signal designating a corresponding memory sub-block and an adjacent block designating signal designating a memory sub-block sharing a corresponding sense amplifier group, said block designating signal and said adjacent block designating signal selectively activated in accordance with said row select instruction and a block address signal specifying a memory sub-block.

6. The semiconductor memory device according to claim 5, wherein
   each of said plurality of isolation control circuits includes a circuit responsive to deactivation of said block designating signal for applying the isolation control signal at a high voltage level to the corresponding isolating gate group, and each of the isolating gate groups includes insulated gate field-effect transistors provided corresponding to the respective columns in the corresponding memory sub-block and receiving on their gates the isolation control signal from a corresponding isolation control circuit.

7. The semiconductor memory device according to claim 5, wherein
   each of said plurality of isolation control circuits includes:
   an isolation control signal output node;
   a first gate element for transmitting a high voltage higher than an operation power supply voltage to the output node in response to deactivation of said block designating signal and of said adjacent block designating signal;
   a second gate element for setting the output node to an intermediate voltage level intermediate said operation power supply voltage and a ground voltage in response to said block designating signal; and
   a third gate element for setting the output node to the ground voltage in response to activation of said adjacent block designating signal.

8. The semiconductor memory device according to claim 7, wherein
said second gate element includes a transfer gate arranged between a node receiving said intermediate voltage and said isolation control signal output node and turned on in response to activation of said block designating signal.

9. The semiconductor memory device according to claim 7, wherein
said second gate element includes a p-channel insulated gate field effect transistor connected between said isolation control signal output node and a ground node and turned on in response to activation of said block designating signal.

10. The semiconductor memory device according to claim 2, wherein said circuit of said control circuitry includes a circuit for causing transition of said selected isolating gate group from said high-resistance but conductive state to said low-resistance and conductive state at a speed lower than a speed of transition to said high-resistance conductive state.

11. The semiconductor memory device according to claim 1, further comprising:
a main data bus arranged commonly to the memory sub-blocks aligned in said column direction, for receiving a data signal from a selected sense amplifier in said plurality of sense amplifier groups;
a preamplifier for amplifying the data signal on said main data bus; and
latch circuitry for latching an output signal of said preamplifier.

12. The semiconductor memory device according to claim 11, wherein
said main data bus includes a plurality of main data line pairs arranged extending in said column direction over the memory sub-blocks aligned in said column direction,
said preamplifier includes a plurality of preamplifier circuits arranged corresponding to said plurality of main data line pairs, respectively, and
said latch circuitry includes a plurality of latch circuits provided corresponding to said plurality of preamplifier circuits.

13. The semiconductor memory device according to claim 1, further comprising:
a main data bus arranged commonly to the memory sub-blocks aligned in the column direction, for transmitting a data signal to a selected sense amplifier in said plurality of sense amplifier groups, and
write circuitry coupled to said main data bus for transmitting write data in data writing, and for latching the write data.

14. The semiconductor memory device according to claim 13, wherein
said main data bus includes a plurality of main data line pairs arranged over the memory sub-blocks aligned in said column direction, and
said write circuitry includes a plurality of write drive circuits arranged correspondingly to said plurality of main data line pairs, and a latch circuit provided corresponding to each of said write drive circuits.

15. The semiconductor memory device according to claim 1, wherein, upon being set to said high resistance but conductive state, the selected isolation gate group allows data in the selected memory cell to be transferred to corresponding said sense amplifier group, but substantially interrupts said data amplified by corresponding said sense amplifier group from being immediately transferred to said selected memory sub block.

16. A semiconductor memory device comprising:
a plurality of memory cells arranged in rows and columns;
a plurality of word lines arranged corresponding to said rows, respectively, each of the word lines connected to memory cells in a corresponding row;
a plurality of bit line pairs arranged corresponding to said columns, each of the bit line pairs connected to memory cells on a corresponding column;
a plurality of sense amplifiers provided corresponding to said plurality of bit line pairs for sensing and amplifying data of memory cells read onto the corresponding bit line pairs when active;
a plurality of transfer gates connected between said plurality of bit line pairs and corresponding sense amplifiers;
row select circuitry for driving a word line arranged corresponding to an addressed row to a selected state in response to a row select instruction;
isolation control circuitry responsive to said row select instruction for setting the transfer gates to a high-resistance state at a timing after the word line arranged corresponding to said addressed row is driven to the selected state, and responsive to an instruction of completing the row selection for setting the transfer gates to a low-resistance state; and
a sense control circuit responsive to said row select instruction for activating said plurality of sense amplifiers, and responsive to said instruction of completing the row selection for deactivating said plurality of sense amplifiers at a timing after said isolation control circuit sets the transfer gates to the low-resistance state,
said row select circuitry including a circuit responsive to said instruction of completing the row selection for driving the selected word line to an unselected state at a timing after said isolation control circuitry completes setting of said low-resistance state.

17. A semiconductor memory device comprising:
a plurality of memory sub-blocks each having a plurality of memory cells arranged in rows and columns, and aligned at least in a direction of said columns;
a plurality of sense amplifier groups arranged for said plurality of memory sub-blocks such that memory sub-blocks adjacent each other in the column direction share a sense amplifier group, and each sense amplifier group activated to sense and amplify data of a selected memory cell in a corresponding memory sub-block;
a plurality of isolating gate groups arranged between said plurality of sense amplifier groups and said plurality of memory sub-blocks for selectively isolating corresponding sense amplifier groups from corresponding memory sub-blocks; and
control circuitry responsive to a row select instruction for setting a selected isolating gate group provided for a selected memory sub-block including the selected memory cell to a non-conductive state after transmission of the data of said selected memory cell to the corresponding sense amplifier group, and for setting an unselected isolating gate group arranged between an unselected share memory sub-block sharing the sense amplifier group with said selected memory sub-block and the shared sense amplifier group to the non-conductive state, responsive to an instruction of completing the row selection for setting said selected isolating gate group to a conductive state and then driving said shared sense amplifier group to an inactive state at a predetermined timing, and responsive to said instruction of completing the row selection for setting said unselected isolating gate group to the conductive state after inactivation of said shared sense amplifier group.

* * * * *